US012341411B2

(12) United States Patent
de Cremoux

(10) Patent No.: US 12,341,411 B2
(45) Date of Patent: Jun. 24, 2025

(54) METHODS AND SYSTEMS FOR CURRENT SENSING

(71) Applicant: Dialog Semiconductor (UK) Limited, London (GB)

(72) Inventor: Guillaume de Cremoux, Edinburgh (GB)

(73) Assignee: Renesas Design (UK) Limited, Bourne End (GB)

( * ) Notice: Subject to any disclaimer, the term of this patent is extended or adjusted under 35 U.S.C. 154(b) by 282 days.

(21) Appl. No.: 17/881,235

(22) Filed: Aug. 4, 2022

(65) Prior Publication Data

US 2023/0155472 A1    May 18, 2023

Related U.S. Application Data

(63) Continuation-in-part of application No. 17/528,075, filed on Nov. 16, 2021, now abandoned.

(51) Int. Cl.
| | |
|---|---|
| *H02M 1/00* | (2007.01) |
| *G01R 19/00* | (2006.01) |
| *G01R 19/255* | (2006.01) |
| *H02M 3/158* | (2006.01) |

(52) U.S. Cl.
CPC ........ *H02M 1/0009* (2021.05); *G01R 19/003* (2013.01); *G01R 19/255* (2013.01); *H02M 3/1582* (2013.01)

(58) Field of Classification Search
CPC .. H02M 3/1582; H02M 3/1584; H02M 3/157; H02M 1/08; H02M 3/156; H02M 1/0009; H02M 3/158
See application file for complete search history.

(56) References Cited

U.S. PATENT DOCUMENTS

| | | | |
|---|---|---|---|
| 9,819,191 B1 * | 11/2017 | Steffan | H02J 3/14 |
| 10,044,267 B1 * | 8/2018 | Childs | H02M 3/156 |
| 10,069,399 B1 | 9/2018 | Sambucco | |
| 10,254,314 B1 * | 4/2019 | Li | H02M 3/1582 |
| 11,081,963 B2 | 8/2021 | Kasturi | |
| 2004/0008016 A1 | 1/2004 | Sutardja | |
| 2006/0152203 A1 * | 7/2006 | Perry | H02M 3/33507 323/283 |
| 2009/0146623 A1 | 6/2009 | de Cremoux | |

(Continued)

OTHER PUBLICATIONS

US Office Action, U.S. Appl. No. 17/528,075, Applicant: Guillaume de Cremoux, Mail date: Jun. 16, 2023, 23 pages.

(Continued)

*Primary Examiner* — Gustavo A Rosario-Benitez
(74) *Attorney, Agent, or Firm* — Salle Ackerman LLC; Stephen B. Ackerman

(57) ABSTRACT

A system comprising a current sensor for sensing an average output current and/or an average input current of a circuit is presented. There is a first switch, the first switch being arranged to selectively couple a sensing node of the circuit to a first voltage, wherein the current sensor comprises a pulse density modulator configured to generate a pulse density modulated signal. The pulse density modulated signal is dependent on an average current flowing through the first switch. The current sensor is configured to sense the average output current and/or the average input current of the circuit using the pulse density modulated signal.

21 Claims, 24 Drawing Sheets

(56) References Cited

U.S. PATENT DOCUMENTS

| | | |
|---|---|---|
| 2009/0299592 A1 | 12/2009 | Oehler |
| 2014/0239925 A1 | 8/2014 | Tanabe |
| 2016/0141957 A1 | 5/2016 | Ozawa |
| 2017/0063228 A1 | 3/2017 | Kimura |
| 2018/0219484 A1* | 8/2018 | Mercer ................. H02M 3/158 |
| 2020/0292586 A1* | 9/2020 | Loccia ................ H02M 3/1582 |
| 2021/0175804 A1* | 6/2021 | Shumkov ............ H02M 3/1582 |
| 2022/0123647 A1* | 4/2022 | Mayell ................ H02M 3/3376 |
| 2022/0196437 A1 | 6/2022 | Maharyta |

OTHER PUBLICATIONS

"Current-Sensing Techniques for DC-DC Converters," by Hassan Pooya Forghani-Zadeh et al., The 2002 45th Midwest Symposium on Circuits and Systems, 2002. MWSCAS-2002, Aug. 4-7, 2002, 4 pages.

Co-pending U.S. Pat. No. DS21-042G, "Methods and Systems for Current Sensing in Power Converters," U.S. Appl. No. 17/528,075, filed Nov. 16, 2021, Guillaume De Cremoux, 59 pages.

* cited by examiner

METHODS AND SYSTEMS FOR CURRENT SENSING

This application is a Continuation-in-Part application of DS21-042G, Ser. No. 17/528,075, filed on Nov. 16, 2021, which is assigned to a common assignee, and which is herein incorporated by reference in its entirety.

TECHNICAL FIELD

The present disclosure relates to methods and systems for current sensing and in particular to methods and systems for sensing the output current and/or the input current of a circuit comprising a switch.

BACKGROUND

Switches, for example comprising transistors, are commonplace in electronic circuits. In various applications it can be desirable to sense the output current or the input current of a circuit comprising a switch.

Switching power converters, such as buck converters, boost converters buck-boost converters or charge pumps are widely used in modern electronic devices. Switching power converters comprise one or more switches, and in these systems, there may be a requirement to sense the output current or the input current.

An example power stage of a buck converter 100 is shown in FIG. 1. The buck converter 100 comprises a switch 102, a switch 104, an inductor 106 and a capacitor 108. The switch 104 has a first terminal coupled to a voltage supply 110 providing a voltage VIN and a second terminal coupled to a switching node 112 (SW). The switch 102 has a first terminal coupled to ground (114) and a second terminal coupled to the node 112. The buck converter 100 further comprises a regulation loop (not shown) for controlling the switch 102 and the switch 104. Said regulation loop may comprise a controller.

The inductor 106 has a first terminal coupled to the node 112 and a second terminal coupled to the capacitor 108. The output voltage VOUT of the buck converter 100 is the voltage taken at a node 116 between the capacitor and the inductor 106. The output current IOUT of the buck converter 100 is the current flowing through the inductor 106.

It will be appreciated that in the case of the buck converter 100 the average output current is the same as the average current IL flowing through the inductor ($\overline{IL}=\overline{IOUT}$).

The switch 102 is often referred to as a "low side" switch and the switch 104 is often referred to as a "high side switch". The switch 102 may comprise a transistor, for example a field effect transistor (FET), such as a MOSFET. The same applies for the switch 104.

As will be known to the person skilled in the art, the switches 102 and 104 are arranged to selectively couple the inductor 106 to ground and to the voltage VIN respectively. The basic operation of the buck converter 100 has the current IOUT and output voltage VOUT fluctuate such that the average output voltage VOUT is equal to the input voltage VIN divided by a predetermined amount.

A load (not shown) may be coupled to the node 116 such that the inductor current IOUT is fed to the load.

In various applications it is desired to monitor the output current IOUT. This may be necessary for various reasons, such as to check that the current remains within a safe range, to optimize power consumption, or for characterizing the power converter behavior, to name just a few. For example, in some applications the current IOUT may be measured at regular intervals, such as at regular intervals of 1 millisecond.

In some applications it is required to sense the average value of IOUT with an accuracy of up to 5% or a better accuracy (error <5%) in all conditions. However, known current sensing systems do not allow to achieve such high accuracy.

Most prior art current sensing systems only allow to get current measurement with an accuracy of about 12% at most. Some current sensing systems allow to achieve higher accuracy however they do so at the expense of very large (and expensive) circuitry and requiring several calibrations.

Some examples of prior art current sensing are described by Hassan Pooya Forghani-zadeh and A. Rincon-Mora, "Current-Sensing Techniques for DC-DC Converters".

FIG. 2A is a schematic diagram of a current sensing system according to the prior art. Common reference numerals and variables between Figures denote common features.

The system 200A uses a sensing resistor 202 on the current output path and measures the voltage drop 204 (V_Rsense) across the resistor 202 in order to detect the output current IOUT. This system is limited in that the use of a resistor 202 (Rsense) causes unwanted energy dissipation. Moreover, the resistor 202 is large and expensive, hence not suitable for most modern device where miniaturization, low cost and low energy dissipation are required. Therefore, the system 200A is not suitable for performing accurate current sensing of the output current IOUT at a low cost.

FIG. 2B is a schematic diagram of another current sensing system according to the prior art. Common reference numerals and variables between Figures denote common features.

The system 200B uses a simple low-pass RC network 206 to filter the voltage across the inductor 106 and sense the current IOUT through the equivalent series resistance (ESR) of the inductor 106. However, this system requires an accurate knowledge of the properties of the inductor 106, such as its inductance L and its impedance RL, which is not always the case for integrated circuit designers. Moreover, in order to detect the current IOUT with the desired accuracy, these properties must be known with very high accuracy and this is not possible since the nominal value of L and RL can often fluctuate by 5% to 30% due to, for example, temperature or electrical de-rating. Therefore, the system 200B is also inappropriate for performing accurate current sensing.

FIG. 3 is a schematic diagram of a further current sensing system according to the prior art. Common reference numerals and variables between Figures denote common features.

The current sensing system 300 uses an RC low-pass filter 302 at the node 112 (SW). The RC low-pass filter 302 comprises a resistor 304 and a capacitor 306. Since the average current through the resistor 304 is zero, the output averaged-current can be derived from the output voltage VOUT and the voltage across the capacitor 306. However, this system still requires an exact knowledge of RL, which again has the same variation/inaccuracy issues as in the system of FIG. 2B.

FIG. 4 is a schematic diagram of yet another current sensing system according to the prior art. Common reference numerals and variables between Figures denote common features.

The current sensing system 400 comprises the buck converter 100, a low side portion 410 and a high side portion 420 as illustrated in FIG. 4.

The high side portion 420 comprises a current-sense amplifier (CSA) 422 (CSAH) having a first input 423, a second input 425 and an output 427; and a sense switch 424 having a source terminal coupled to the voltage source 110 and a drain terminal coupled to the second input 425 of the CSA 422. The output 427 of the CSA 422 is coupled to the gate of a MOSFET switch 426. The source terminal of the MOSFET 426 is coupled to the second terminal of the sensor switch 424.

The low side portion 410 comprises a current-sense amplifier (CSA) 412 (CSAH) having a first input 413, a second input 415 and an output 417; and a sense switch 414 having a source terminal coupled to the voltage source 110 and a drain terminal coupled to the first input 413 of the CSA 412. The output 417 of the CSA 412 is coupled to the gate of a MOSFET switch 416. The source terminal of the MOSFET 416 is coupled to the second terminal of the sensor switch 414.

The switches 414 and 424 are chosen such that they are smaller than the low side switch 102 and the high side switch 104 respectively by a predetermined scaling factor S. For example, S may be 1000.

The switches of the high side and low side portion are operated such that the high side switch 104 and the sensor switch 424 are on (closed) when the low side switch 102 and the sensor switch 414 are off (open); and vice versa.

The output current IOUT to be sensed is equal to the inductor current which in turn is equal to the current IHS flowing through the high side switch 104 when the switches 104 and 424 are on (i.e. the high side portion of the circuit 400 is in operation); and, IOUT (IL) is equal to the current ILS flowing through the low switch 102 when the switches 102 and 414 are closed (i.e. the low side portion of the circuit 400 is in operation).

In operation, when the high side switch 104 is on, IL=IOUT=IHS and the current sensing is done by the combination of the current-sense amplifier 422 (CSAH) and the MOSFET switch 426, which yield a current IHS/S through the MOSFET 426.

When the low side switch is on, IL=IOUT=ILS and the current sensing is done by the combination of the current-sense amplifier 412 (CSAL) and the MOSFET 416, which cause a current IHS/S through the MOSFET 416.

By measuring the current through the drain of the MOSFET 416 and 426 respectively, it is possible to determine at all times the current IOUT (simply multiplying by S) without the need for large dissipative resistors, thus achieving lossless current sensing. For example, this may be done by copying and injecting said current into an accurate sensing resistor coupled to an ADC.

However, the system 400 presents various disadvantages:
it uses multiple sensor switches and must include extra "masking" switches at the input of the amplifier CSAL and CSAH to de-couple them from the node SW when the high side switch and low side switch are off respectively;
when the high side switch 104 is turned off and the low side switch 102 is on (or vice versa), there is a dead-time in which both switches are off that cumulates the dead-zone, masking/demasking and the current-sense amplifiers' settling and that at 4 MHz can take up to 10% of the total sensing time and thus corrupt the measurement;
it requires long trimming procedures to match the two current-sense amplifiers paths;
it has a high consumption since the current-sense amplifiers 422 and 412 must be fast in order to properly track the variation of the output current IOUT=IL). Such high consumption is not suitable in most applications and in addition makes it difficult to use the sensing system 400 for sensing the output current of switching power converters operated in PFM mode, since in this case the supply current fed to the amplifiers 422 and 412 must be reduced (unless a very fast wake-up procedure in ~100 ns is implemented, in which case however trimming/biasing would be difficult to properly restore).

All of the above prior art systems require an analog-to-digital converter (ADC) for analog post-processing. For an integrated circuit comprising e.g. 10 buck converters, this means that in order to track the history of IOUT with the desired accuracy, it would be necessary to have either multiplexing with a single ADC configured for multi-slot measurements and a separate large (1 ms time-constant) analog low pass filter for each channel; or, a separate ADC on each channel, still requiring a low pass filter on each channel.

It will be appreciated that the aforementioned issues are also present when sensing the input current of switching power converters, in accordance with the understanding of the skilled person.

SUMMARY

Hence there is a need for a current-sensing system to sense the output current and/or the input current of switching power converters which is capable of providing higher accuracy whilst overcoming the limitations of prior art systems.

Switching power converters are provided as one example. It will be appreciated other systems will also benefit from higher accuracy current sensing that overcomes the limitations of known systems.

It is an object of the disclosure to address one or more of the above-mentioned limitations.

According to a first aspect of the disclosure there is provided a system comprising a current sensor for sensing an average output current and/or an average input current of a circuit comprising a first switch, the first switch being arranged to selectively couple a sensing node of the circuit to a first voltage, wherein the current sensor comprises a pulse density modulator configured to generate a pulse density modulated signal, the pulse density modulated signal being dependent on an average current flowing through the first switch; and the current sensor is configured to sense the average output current and/or the average input current of the circuit using the pulse density modulated signal.

Optionally, sensing the average output current and/or the average input current of the circuit using the pulse density modulated signal comprises counting a number of pulses in the pulse modulated signal.

Optionally, the pulse density modulator comprises a differential circuit having a first input and a second input; and the pulse density modulator is configured to generate the pulse density modulated signal based on a difference between a sensing signal and a compensating signal; wherein the compensating signal comprises a difference between a voltage coupled to the first input and the first voltage; and the sensing signal comprises a difference between a voltage coupled to the second input and the first voltage.

Optionally, the pulse density modulator comprises a sensor switch, the sensor switch having an internal resistance which is dependent on an internal resistance of the first switch; the pulse density modulator is configured to selectively provide a sensor current to the sensor switch; and the current sensor is configured such that the sensing signal is dependent on an average current flowing through the first switch; and the compensating signal is dependent on an average current flowing through the sensor switch.

Optionally, selectively providing a sensor current to the sensor switch comprises only providing a sensor current to the sensor switch when a pulse is generated by the pulse density modulator.

Optionally, the pulse density modulator comprises a sensor current supply configured to provide the sensor current to the sensor switch; and a DAC switch coupled to the pulse density modulated signal, the DAC switch being configured to selectively provide a path for the sensor current; wherein selectively providing a path for the sensor current comprises providing a path for the sensor current only when a pulse is generated by the pulse density modulator.

Optionally, the pulse density modulated signal is a signal configured to be either in a logic 0 state or in a logic 1 state; the pulse density modulator is operated according to a clock signal: and a pulse is any clock cycle in which the pulse density modulated signal is in the logic 1 state.

Optionally, the pulse density modulator is a multi-bit pulse density modulator; and the pulse density modulated signal is a signal configured to be either in a logic 0 state or in one of a plurality of logic non-zero states.

Optionally, the current sensor is configured to provide the number of pulses in the pulse modulated signal over a predetermined period of time.

Optionally, the current sensor comprises a counter for counting the number of pulses in the pulse modulated signal; the counter is operated according to the clock signal; and the predetermined period of time comprises a predetermined number of clock cycles.

Optionally, the circuit is a switching power converter comprising an energy storage element and the first switch is a power converter switch, Optionally, the energy storage element and the power converter switch are coupled at the sensing node.

Optionally, the power converter switch is one of a low side switch and a high side switch.

Optionally, the system comprises one or more return to zero switches, wherein the one or more return to zero switches are controlled according to a fraction of a switching period of the power converter switch; and the one or more return to zero switches are configured to zero the difference between the sensing signal and the compensating signal when the power converter switch is open.

Optionally, the fraction of the switching period is a duty cycle.

Optionally, the sensor switch has a first terminal coupled to a compensating node and a second terminal coupled to the first voltage at a converter reference node.

Optionally, the pulse density modulator comprises one or more first coupling switches for selectively coupling the first input to the switching node; and one or more second coupling switches for selectively coupling the second input to the converter reference node; wherein selectively coupling the first input to the switching node comprises only coupling the first input to the switching node during a fraction of a switching period of the power converter switch; and selectively coupling the second input to the converter reference node comprises only coupling the second input to the converter reference node during a fraction of a switching period of the power converter switch.

Optionally, the fraction of the switching period is a duty cycle.

Optionally, when the first switch is open, the first input and the second input are both coupled to the first voltage.

Optionally, the pulse density modulator is configured such that the compensating signal is dependent on a voltage difference between the compensating node and the converter reference node; and the compensating signal is dependent on a fraction of a switching period of the power converter switch; wherein the number of pulses in the pulse modulated signal over the predetermined period of time provides a measure of the average output current and/or the average input current of the switching power converter over the predetermined period of time.

Optionally, the fraction of the switching period is a duty cycle.

Optionally, the pulse density modulator comprises one or more first return to zero switches for selectively coupling the first input to the compensating node; and selectively coupling the first input to the compensating node comprises only coupling the first input to the compensating node during a fraction of a switching period of the power converter switch.

Optionally, the fraction of the switching period is a duty cycle.

Optionally, the pulse density modulator is configured such that the compensating signal is equal or approximately equal to a voltage difference between the compensating node and the converter reference node; and the number of pulses in the pulse modulated signal over the predetermined period of time provides a measure of the average current flowing through the power converter switch over the predetermined period of time.

Optionally, the current sensor comprises a digital correction stage configured to compute the average output current and/or the average input current of the switching power converter, wherein computing the average output current and/or the average input current of the switching power converter comprises digitally multiplying the number of pulses in the pulse modulated signal over the predetermined period of time by a fraction of a switching period of the power converter switch.

Optionally, the fraction of the switching period is a duty cycle.

Optionally, the second input is coupled to the compensating node; and the current sensor comprises one or more third coupling switches for selectively coupling the first input to the switching node; wherein selectively coupling the first input to the switching node comprises only coupling the first input to the switching node during a fraction of a switching period of the power converter switch; and coupling the first input to the converter reference node for the remaining time.

Optionally, the fraction of the switching period is a duty cycle.

Optionally, the system further comprises one or more second return to zero switches for selectively coupling the compensating node to the converter reference node, wherein selectively coupling the compensating node to the converter reference node comprises only coupling the compensating node to the converter reference node during a fraction of a switching period of the power converter switch.

Optionally, the fraction of the switching period is a duty cycle.

Optionally, the switching power converter is a buck converter, a boost converter, a buck-boost converter or a charge pump.

Optionally, the switching power converter is a buck-boost converter comprising a boost low side switch; and the current sensor comprises one or more third return to zero switches for selectively coupling the first input to the converter reference node; wherein selectively coupling the first input to the first voltage comprise only coupling the second input to the converter reference node during a fraction of a switching period of the boost low side switch.

Optionally, the fraction of the switching period is a duty cycle.

Optionally, the pulse density modulator comprises a sigma delta modulator.

Optionally, the system comprises the circuit.

According to a second aspect of the disclosure there is provided a method for sensing an average output current and/or an average input current of a circuit comprising a first switch, the first switch being arranged to selectively couple a sensing node of the circuit to a first voltage, the method comprising: providing a current sensor comprising a pulse density modulator; generating via the pulse density modulator a pulse density modulated signal, wherein the pulse density modulated signal is dependent on an average current flowing through the first switch; and sensing the average output current and/or the average input current of the circuit using the pulse density modulated signal.

The method of the second aspect may also incorporate using or providing features of the first aspect and various other steps as disclosed herein.

According to a third aspect of the disclosure there is provided a system comprising a current sensor for sensing an average output current and/or an average input current of a switching power converter comprising an energy storage element and a power converter switch coupled at a switching node, the power converter switch being arranged to selectively couple the energy storage element to a converter reference voltage, wherein the current sensor comprises a pulse density modulator configured to generate a pulse density modulated signal, the pulse density modulated signal being dependent on an average current flowing through the power converter switch; and the current sensor is configured to sense the average output current and/or the average input current of the switching power converter using the pulse density modulated signal.

Optionally, sensing the average output current and/or the average input current of the switching power converter using the pulse density modulated signal comprises counting a number of pulses in the pulse modulated signal.

Optionally, the pulse density modulator comprises a differential circuit having a first input and a second input; and the pulse density modulator is configured to generate the pulse density modulated signal based on a difference between a sensing signal and a compensating signal; wherein the compensating signal comprises a difference between a voltage coupled to the first input and the converter reference voltage; and the sensing signal comprises a difference between a voltage coupled to the second input and the converter reference voltage.

Optionally, the system comprises one or more return to zero switches, wherein the one or more return to zero switches are controlled according to a fraction of a switching period of the power converter switch; and the one or more return to zero switches are configured to zero the difference between the sensing signal and the compensating signal when the power converter switch is open.

Optionally, the fraction of the switching period is a duty cycle.

Optionally, the pulse density modulator comprises a sensor switch, the sensor switch having an internal resistance which is dependent on an internal resistance of the power converter switch; the pulse density modulator is configured to selectively provide a sensor current to the sensor switch; and the current sensor is configured such that the sensing signal is dependent on an average current flowing through the power converter switch; and the compensating signal is dependent on an average current flowing through the sensor switch.

Optionally, selectively providing a sensor current to the sensor switch comprises only providing a sensor current to the sensor switch when a pulse is generated by the pulse density modulator.

Optionally, the pulse density modulator comprises a sensor current supply configured to provide the sensor current to the sensor switch; and a DAC switch coupled to the pulse density modulated signal, the DAC switch being configured to selectively provide a path for the sensor current; wherein selectively providing a path for the sensor current comprises providing a path for the sensor current only when a pulse is generated by the pulse density modulator.

Optionally, the pulse density modulated signal is a signal configured to be either in a logic 0 state or in a logic 1 state; the pulse density modulator is operated according to a clock signal: and a pulse is any clock cycle in which the pulse density modulated signal is in the logic 1 state.

Optionally, the pulse density modulator is a multi-bit pulse density modulator; and the pulse density modulated signal is a signal configured to be either in a logic 0 state or in two or more non-zero state.

Optionally, the current sensor is configured to provide the number of pulses in the pulse modulated signal over a predetermined period of time.

Optionally, the current sensor comprises a counter for counting the number of pulses in the pulse modulated signal; the counter is operated according to the clock signal; and the predetermined period of time comprises a predetermined number of clock cycles.

Optionally, the sensor switch has a first terminal coupled to a compensating node and a second terminal coupled to the converter reference voltage at a converter reference node.

Optionally, the pulse density modulator comprises one or more first coupling switches for selectively coupling the first input to the switching node; and one or more second coupling switches for selectively coupling the second input to the converter reference node; wherein selectively coupling the first input to the switching node comprises only coupling the first input to the switching node during a fraction of a switching period of the power converter switch; and selectively coupling the second input to the converter reference node comprises only coupling the second input to the converter reference node during a fraction of the switching period of the power converter switch.

Optionally, the fraction of the switching period is a duty cycle.

Optionally, when the power converter switch is open, the first input and the second input are both coupled to the first reference voltage.

Optionally, the pulse density modulator is configured such that the compensating signal is dependent on a voltage difference between the compensating node and the converter reference node; and the compensating signal is dependent on a fraction of the switching period of the power converter switch; wherein the number of pulses in the pulse modulated signal over the predetermined period of time provides a measure of the average output current and/or the average input current of the switching power converter over the predetermined period of time.

Optionally, the fraction of the switching period is a duty cycle.

Optionally, the pulse density modulator comprises one or more first return to zero switches for selectively coupling the first input to the compensating node; and selectively coupling the first input to the compensating node comprises only coupling the first input to the compensating node during a fraction of a switching period of the power converter switch.

Optionally, the fraction of the switching period is a duty cycle.

Optionally, the pulse density modulator is configured such that the compensating signal is equal or approximately equal to a voltage difference between the compensating node and the converter reference node; and the number of pulses in the pulse modulated signal over the predetermined period of time provides a measure of the average current flowing through the power converter switch over the predetermined period of time.

Optionally, the current sensor comprises a digital correction stage configured to compute the average output current and/or the average input current of the switching power converter, wherein computing the average output current and/or the average input current of the switching power converter comprises digitally multiplying the number of pulses in the pulse modulated signal over the predetermined period of time by a fraction of a switching period of the power converter switch.

Optionally, the fraction of the switching period is a duty cycle.

Optionally, the second input is coupled to the compensation node; and the current sensor comprises one or more third coupling switches for selectively coupling the first input to the switching node; wherein selectively coupling the first input to the switching node comprises only coupling the first input to the switching node during a fraction of a switching period of the power converter switch; and coupling the first input to the converter reference node for the remaining time.

Optionally, the fraction of the switching period is a duty cycle.

Optionally, the system further comprises one or more second return to zero switches for selectively coupling the compensating node to the converter reference node, wherein selectively coupling the compensating node to the converter reference node comprises only coupling the compensating node to the converter reference node during a fraction of a switching period of the power converter switch.

Optionally, the fraction of the switching period is a duty cycle.

Optionally, the switching power converter is a buck converter, a boost converter, a buck-boost converter or a charge pump.

Optionally, the switching power converter is a buck-boost converter comprising a boost low side switch; and the current sensor comprises one or more third return to zero switches for selectively coupling the first input to the converter reference node; wherein selectively coupling the first input to the converter reference voltage comprise only coupling the second input to the converter reference node during a fraction of a switching period of the boost low side switch.

Optionally, the fraction of the switching period is a duty cycle.

Optionally, the pulse density modulator comprises a sigma delta modulator.

Optionally, the system comprises the switching power converter.

According to a fourth aspect of the disclosure there is provided a method for sensing an average output current and/or an average input current of a switching power converter comprising an energy storage element and a power converter switch coupled at a switching node, the power converter switch being arranged to selectively couple the energy storage element to a converter reference voltage, the method comprising: providing a current sensor comprising a pulse density modulator; generating via the pulse density modulator a pulse density modulated signal, wherein the pulse density modulated signal is dependent on an average current flowing through the power converter switch; and sensing the average output current and/or the average input current of the switching power converter using the pulse density modulated signal.

The method of the fourth aspect may also incorporate using or providing features of the third aspect and various other steps as disclosed herein.

BRIEF DESCRIPTION OF THE DRAWINGS

The disclosure is described in further detail below by way of example and with reference to the accompanying drawings, in which.

DESCRIPTION

Figure 1:
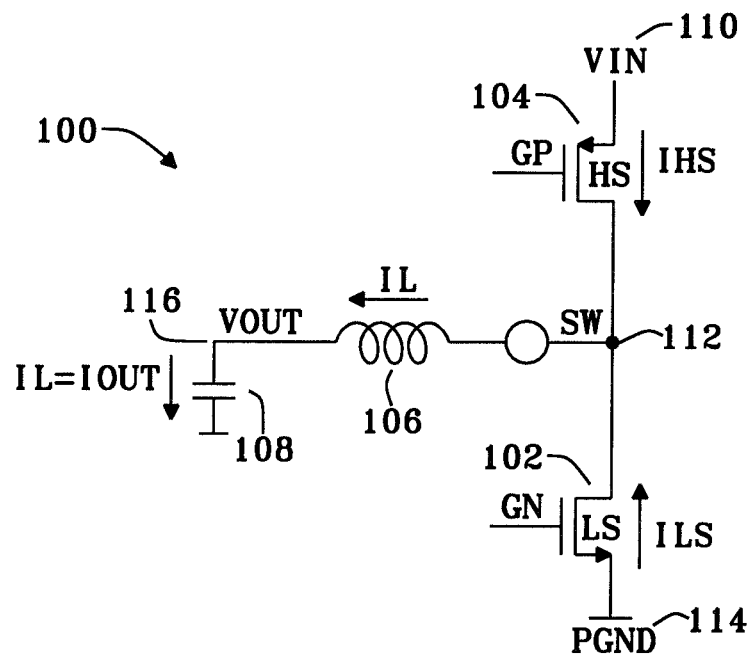
FIG. 1 is a schematic diagram of a power stage of a buck converter according to the prior art.
Figure 2A:
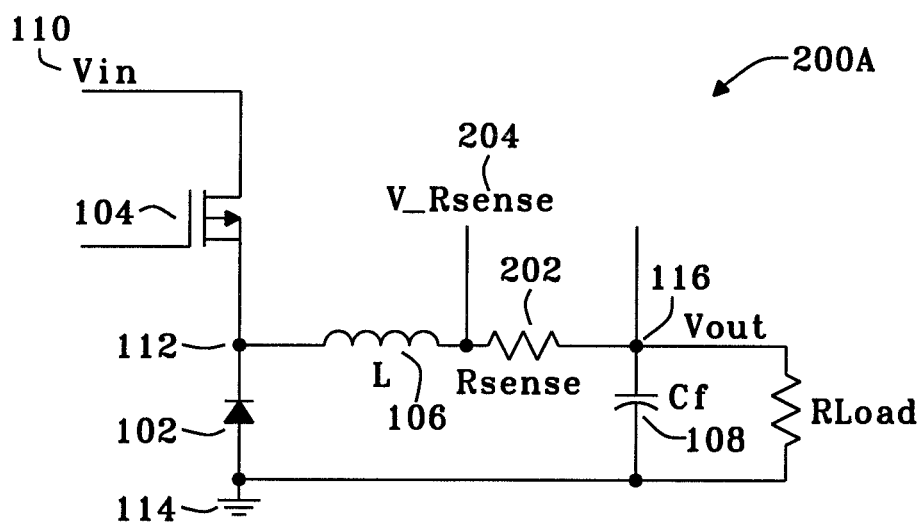
FIG. 2A is a schematic diagram of a current sensing system according to the prior art.
Figure 2B:
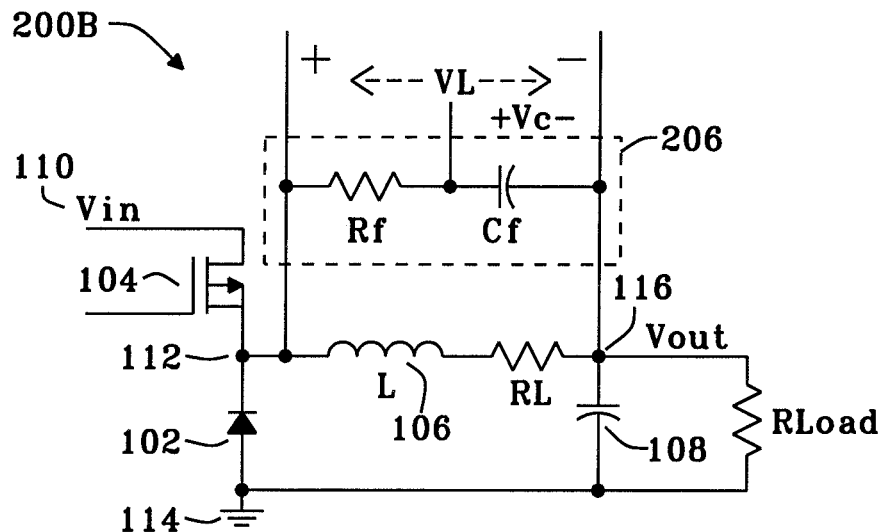
FIG. 2B is a schematic diagram of another current sensing system according to the prior art.
Figure 3:
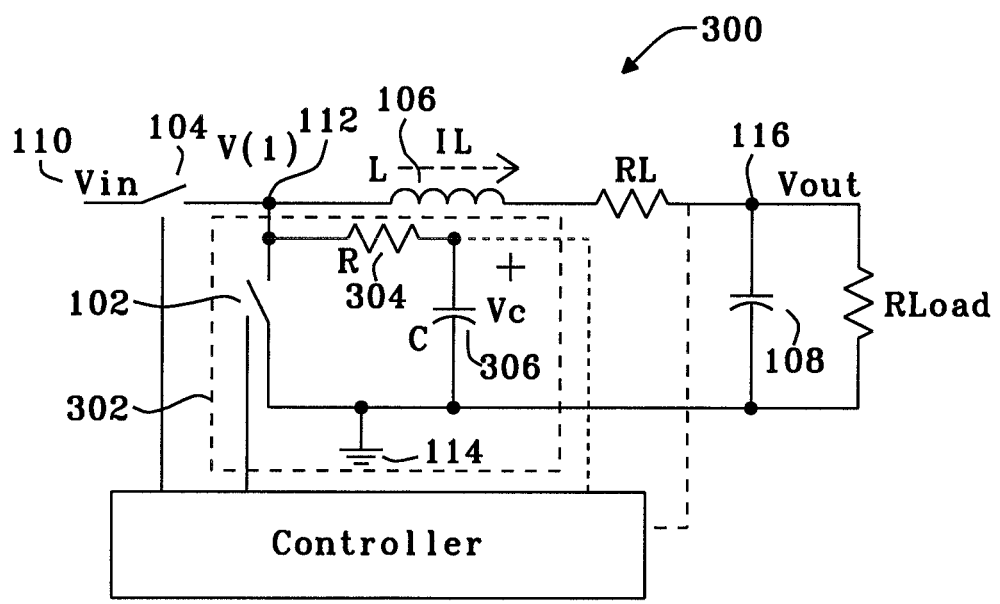
FIG. 3 is a schematic diagram of a further current sensing system according to the prior art.
Figure 4:
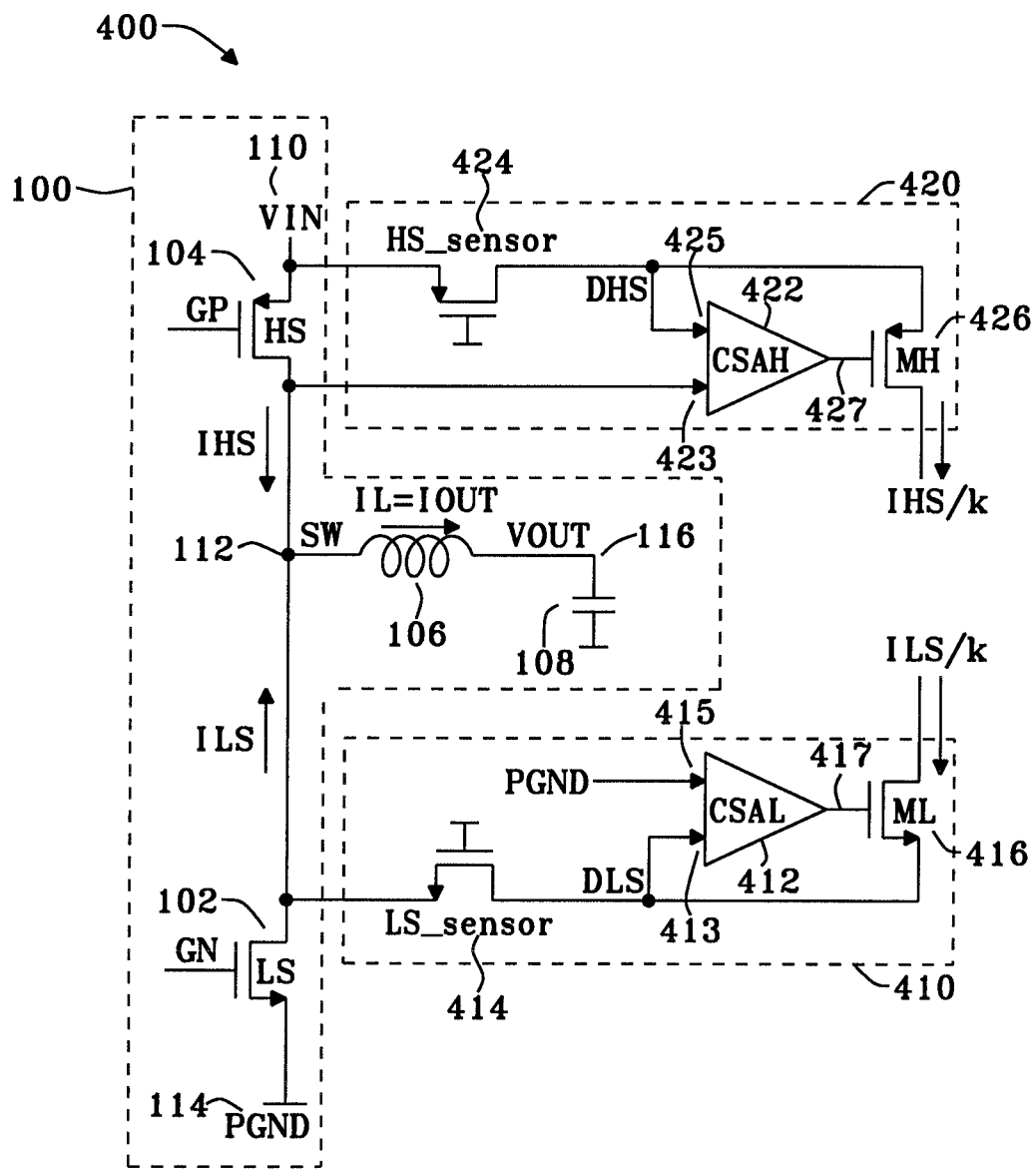
FIG. 4 is a schematic diagram of yet another current sensing system according to the prior art.
Figure 5:
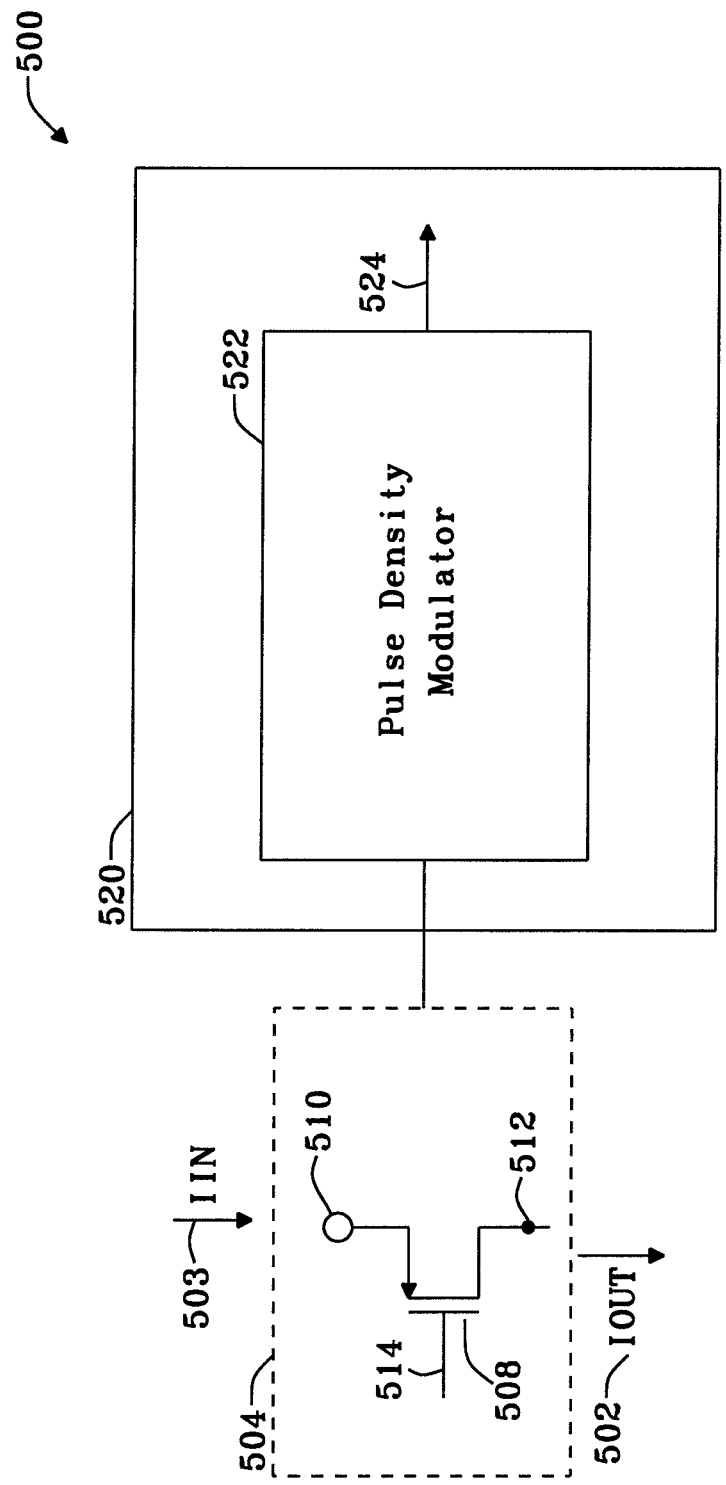
FIG. 5 is a schematic diagram of a system according to a first embodiment of the present disclosure.

FIG. 5 is a schematic diagram of a system 500 according to a first embodiment of the disclosure for sensing an output current 502 (IOUT) and/or an input current 503 (IIN) of a circuit 504.

The circuit 504 comprises a switch 508. The switch 508 is arranged to selectively couple a sensing node 512 to a first voltage 510. The first voltage may be referred to as a reference voltage.

By "selectively couple" it is meant that the switch 508 acts to couple the sensing node 512 to the reference voltage 510 or to decouple the sensing node 512 from the reference voltage 510 based on a control signal received by the switch 508 during operation of the circuit 504.

It will be appreciated that the word "couple" may refer to a direct connection where no elements are located in between the elements which are "coupled"; or, an indirect connection where one or more additional elements may be provided between the elements which are "coupled". Furthermore, it will be appreciated that an element may be coupled to one or more other elements.

The switch 508 may comprise a transistor, for example a p-type or an n-type transistor, with the control signal being received at a gate 514 of the transistor. The reference voltage 510 may, for example, be referred to as a supply voltage, an input voltage or ground depending on the application.

The system 500 comprises a current sensor 520. The current sensor 520 comprises a pulse density modulator (PDM) 522 configured to generate a pulse density modulated signal 524 which is dependent on an average of the current ISW flowing through the switch 508. The current sensor 520 is configured to sense the average output current and/or the average input current of the circuit 500 using the pulse density modulated signal.

The circuit 504 may be for example a power converter. For example, the circuit 504 may be a switching power converter, such as, but not limited to, a buck converter, a boost converter or a buck-boost converter. The power converter may be an inductive power converter or a capacitive power converter (charge pump). The power converter may be an AC-DC power converter or a DC-DC power converter. The switch 508 may be a switch of any of said power converters.

Figure 6:
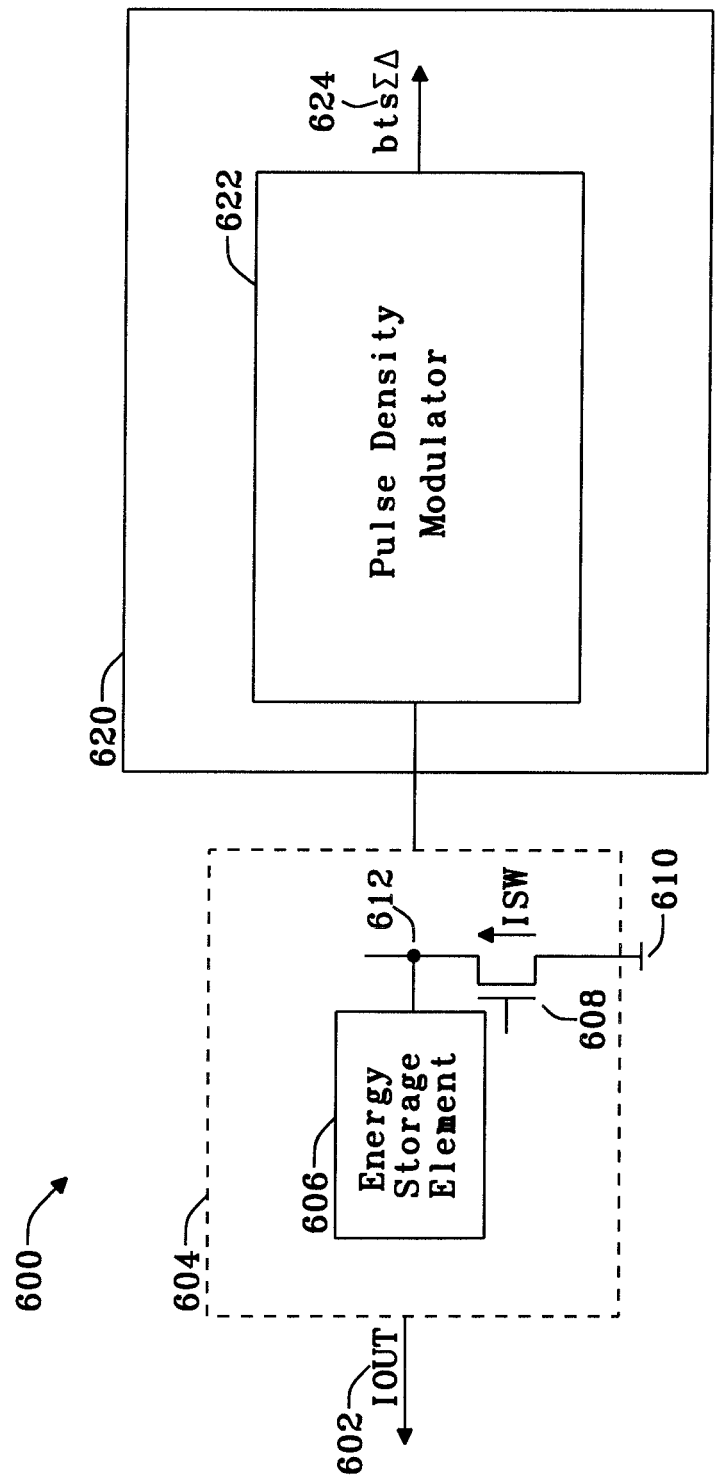
FIG. 6 is a schematic diagram of a system according to a second embodiment of the system of FIG. 5.

FIG. 6 is a schematic diagram of a system 600 for sensing an output current 602 (IOUT) of a switching power converter 604, according to a second embodiment of the present disclosure.

It will be appreciated that in a further embodiment, the system 600 may be configured to sense an input current 603 (IIN) of the switching power converter 604 in addition to or as an alternative to sensing the output current 602.

It will be appreciated that the embodiments described herein in relation to average output current sensing may be applied to average input current sensing, in accordance with the understanding of the skilled person.

Furthermore, the systems described herein may be adapted to provide both average input current sensing and average output current sensing in accordance with the understanding of the skilled person.

The switching power converter 604 comprises an energy storage element 606 and a power converter switch 608. The energy storage element 606 may be for example a capacitor or an inductor. The energy storage element 606 and the power converter switch 608 are coupled at a sensing node 612. The sensing node 612 may also be referred to herein as a switching node. The power converter switch 608 is arranged to selectively couple the switching node 612, and therefore the energy storage element 606, to a first voltage 610. The first voltage 610 may be referred to as a converter reference voltage 610. By "selectively couple" it is meant that the switch 608 acts to couple the energy storage element 606 to the converter reference voltage 610 or to decouple the energy storage element 606 from the converter reference voltage 610 based on a control signal received by the switch 608 during operation of the switching power converter 604.

The power converter switch 608 may comprise a transistor, for example a p-type or an n-type transistor, with the control signal being received at a gate of the transistor. The converter reference voltage 610 may, for example, be referred to as a supply voltage, an input voltage or ground depending on the application.

Operation of power switching converters is known to the person skilled in the art. The power converter switch 608 may be controlled to be alternatively on (closed) and off (open). In particular the power converter switch 608 may be controlled such that it is on (closed) for a predetermined duty cycle and it is off (open) for the remaining time.

The system 600 comprises a current sensor 620. The current sensor 620 comprises a pulse density modulator (PDM) 622 configured to generate a pulse density modulated signal 624 (btsΣΔ) which is dependent on an average of the current ISW flowing through the power converter switch 608. The current sensor 620 is configured to sense the average output current of the switching power converter using the pulse density modulated signal. It will be appreciated that in an alternative embodiment the current sensor 620 may be configured to sense the average input current of the switching power converter using the pulse density modulated signal.

The system 600 is a specific embodiment of the system 500 that has been applied to sensing the output current of a switching power converter. It will be appreciated that the switch 508 may correspond to the switch 608; the sensing node 512 may correspond to the sensing node 612; and the first voltage 510 may correspond to the converter reference voltage 610.

Figure 7A:
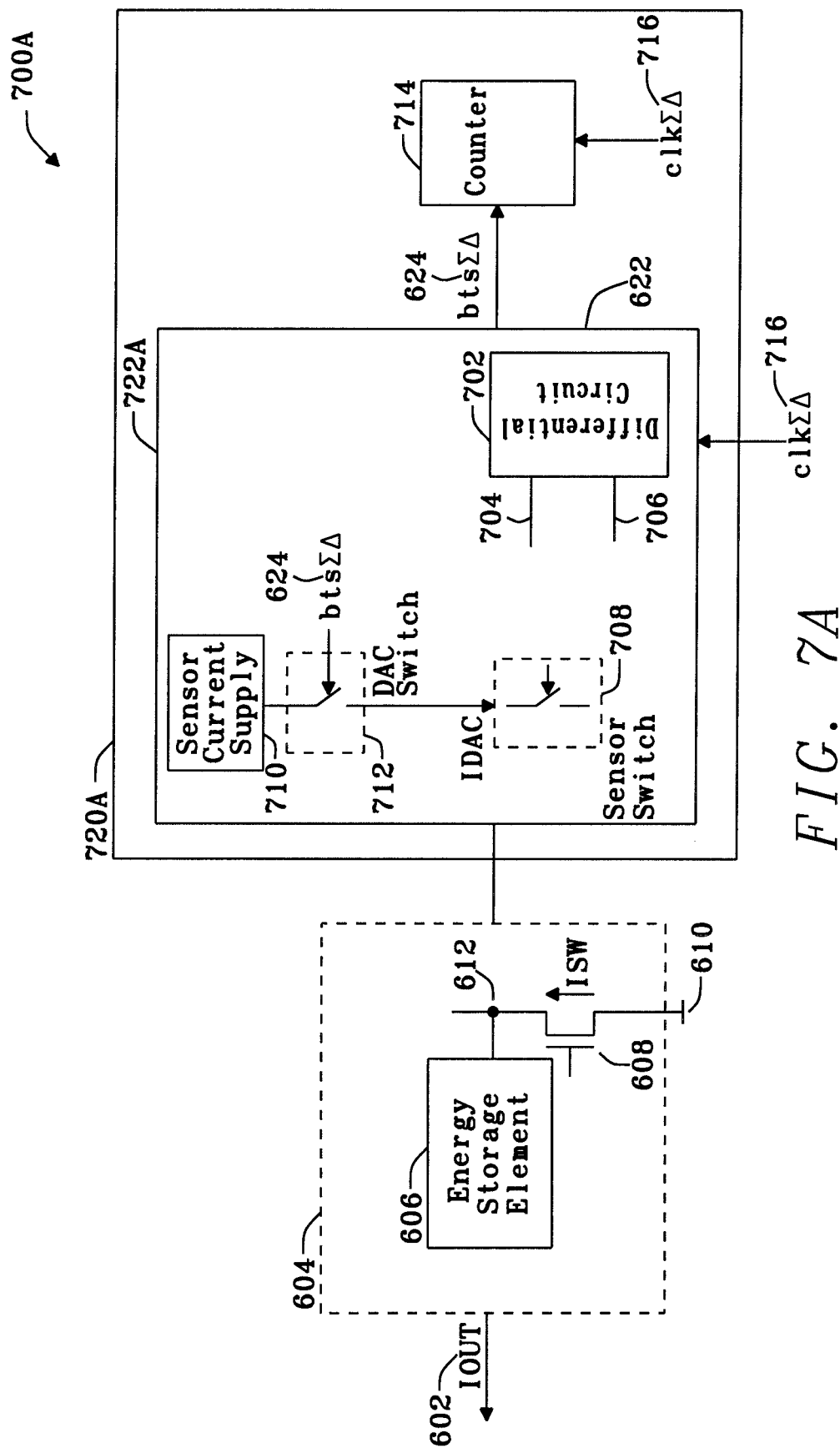
FIG. 7A is a schematic diagram showing a specific implementation of the system of FIG. 6.

FIG. 7A is a schematic diagram of a system 700A showing a specific implementation of the system 600, according to a specific embodiment of the present disclosure. Common reference numerals and variables between Figures denote common features.

The system 700A comprises a current sensor 720A which corresponds to the current sensor 620. The current sensor 720A comprises a pulse density modulator 722A which comprises a differential circuit 702 having a first input 704 and a second input 706.

The pulse density modulator 722A is configured to receive a first differential signal via the first input 704 and a second differential signal via the second input 706, both differential signals being relative to the converter reference voltage 610. In particular, the first differential signal, also referred to hereinafter as compensating signal, is given by the difference between a voltage coupled to the first input 704 and the converter reference voltage 610, and the second differential signal, also referred to hereinafter as sensing signal, is the difference between the voltage coupled to the second input 706 and the power converter voltage 610. The pulse density modulator 722A is configured to generate the pulse density modulated signal 624 based on the difference between the sensing signal and the compensating signal.

The pulse density modulator 722A may further comprise a sensor switch 708 and be configured to selectively provide a sensor current IDAC to said switch 708. The sensor switch 708 may be chosen such that its internal resistance is equal or approximately equal to the internal resistance of the power converter switch 608 scaled by a factor k. In particular, the sensor switch 708 may be chosen such that its internal resistance RSensor, is given by RSensor=RSDON× k, where RSDON is the internal resistance of the power converter switch 608.

The current sensor 720A may be configured such that the sensing signal is dependent on an average current flowing through the power converter switch 608; and the compensating signal is dependent on an average current flowing through the sensor switch 708.

The pulse density modulator 722A may comprise a sensor current supply 710 which is used for selectively providing the current IDAC to the sensor switch 708. Selectively providing the current to the sensor switch 708 may comprise only providing said current to the sensor switch 708 when a pulse is generated by the pulse density modulator 722A. For example, the pulse density modulator 722A may comprise a DAC switch 712 coupled to the pulse density modulated signal 624 via a feedback loop and configured to open and close according to the pulse density modulated signal 624. The DAC switch 712 may be coupled to the sensor current supply 710 in such a way that: when a pulse is generated by the pulse density modulator, the DAC switch provides a path for the sensor current; otherwise, no path is provided for the sensor current. The current supply 710 may be coupled to a power supply. In some embodiments the sensor switch 708, the DAC switch 712 and the current supply 710 may be coupled in series, with the DAC switch 712 being coupled between the sensor switch 708 and the current supply 710. In other embodiments the sensor switch 708, the DAC switch 712 and the current supply 710 may be coupled in series, with the current supply 710 being provided between the sensor switch and the DAC switch being configured to couple/de-couple the current supply to/from the power supply respectively.

The current supply may be configured such that the current IDAC provided to the sensor is dependent on the full-scale current of the pulse density modulator via a scaling factor 1/k, where the full scale current of the pulse density modulator is selected to be at least equal to a predicted or estimated full scale current IFS of the switching power converter 804, i.e. the maximum current predicted to be output by the switching power converter 804.

Generally, the full scale current of the pulse density modulator is selected such that it is equal to IFS+OH, where OH is a predetermined overhead to ensure stability of the pulse density modulator.

In specific embodiments, IDAC may be chosen to be equal or approximately equal to (IFS+OH)/k such that if the internal resistance of the sensor switch 708 is RSDON×k, then the voltage across the sensor switch 708 is approximately RSDON×(IFS+OH).

It will be appreciated that the sensor current supply 710 may be implemented in any way known to the person skilled in the art. For example, the sensor current supply 710 may comprise a passive current source provided by a voltage source and a resistor coupled to the sensor switch 708, and the DAC switch may be connected between the voltage source and the resistor such that when the DAC switch is open there is no current path and therefore no current, and when the DAC switch is closed there is a current path and a current flows through the sensor switch. Or, the current supply 710 may comprise an active current source coupled to the sensor switch and the DAC switch, as shown in some of the embodiments described herein.

In preferred embodiments, the pulse density modulated signal 624 (btsΣΔ) is a binary signal configured to be either in a logic 1 state or in a logic 0 state; the pulse density modulator 622 has a feedback loop 728 comprising the DAC switch 712 and the pulse density modulator 722 is configured to provide a current path for the current IDAC only when the PDM signal 624 is in the logic 1 state.

The number of pulses in the pulse density modulated signal 624 may be the number of bits in the pulse density modulated signal. The pulse density modulator may be operated according to a clock signal 716 and, in the case of a binary signal, a pulse may be defined as any clock cycle in which the pulse density modulated signal 624 is in the logic 1 state.

It will be appreciated that although the following description focuses on embodiments in which the pulse density modulated signal 624 is a binary signal, in principle the pulse density modulator 622 may also be a multi-bit pulse density modulator configured to output a multi-bit signal, though this would imply certain disadvantages such as higher consumption and therefore may not be suitable for certain applications. In this case the pulse density modulated signal may be in more than two states. In particular, the pulsed density modulated signal may be in a logic zero state or in one of a plurality of logic non-zero states, and each non-zero state may correspond to a different number of bits.

The current sensor 620 may be configured to provide the number of pulses in the pulse modulated signal over a predetermined period of time Δt and it may comprise a counter 714 for counting said number of pulses over Δt. The counter 714 may be operated according to the clock signal 716 and the period of time Δt may comprise a predetermined number of clock cycles.

Figure 7B:
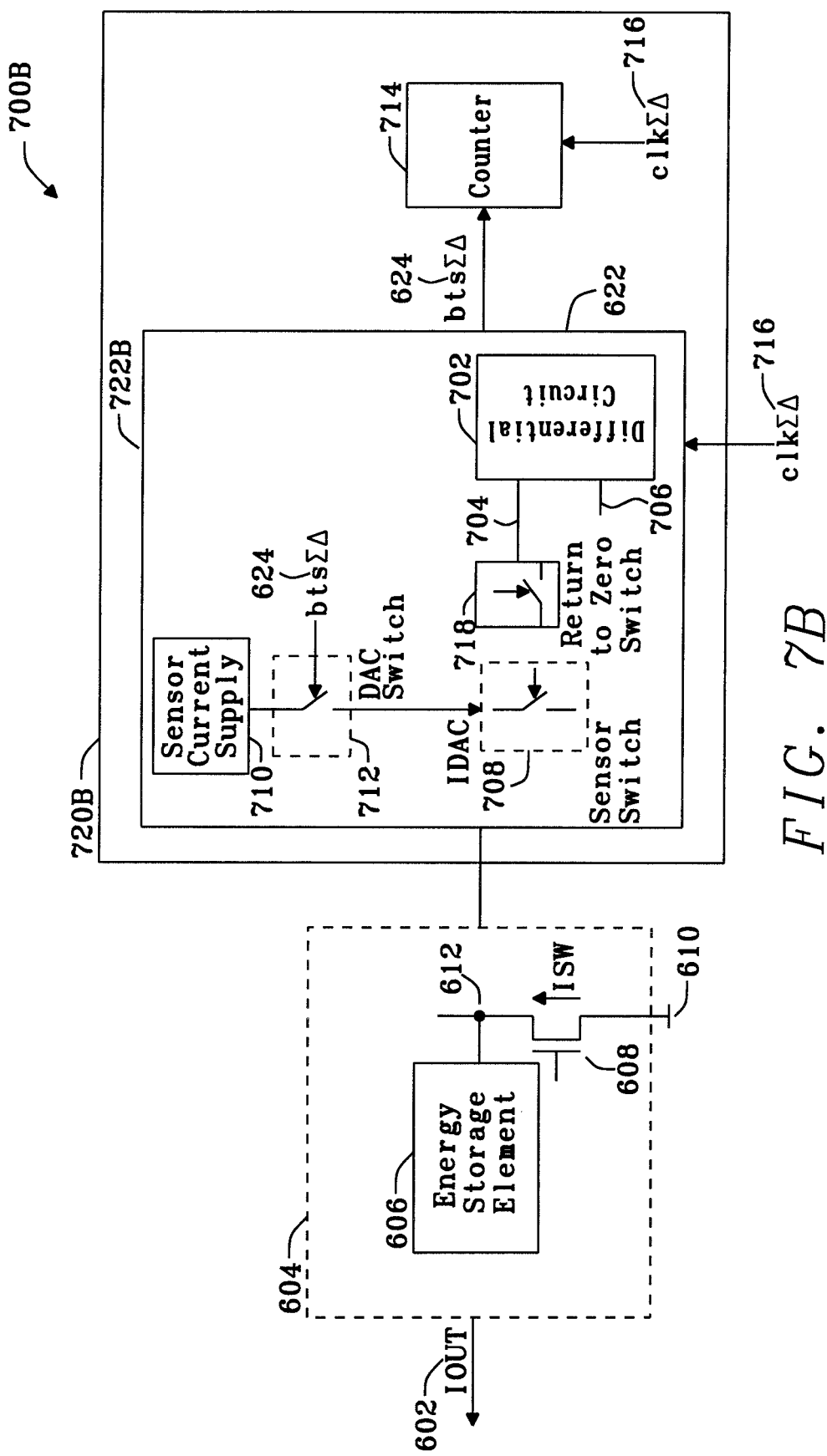
FIG. 7B is a schematic diagram showing a further specific implementation of the system of FIG. 6.

FIG. 7B is a schematic diagram of a system 700B showing a further specific implementation of the system 600, according to a further specific embodiment of the present disclosure. Common reference numerals and variables between Figures denote common features.

In this embodiment, the pulse density modulator (722B) comprises one or more return to zero switches 718, which are controlled according to a fraction of a switching period (for example, a duty cycle) of the power converter switch 608 and which are configured to zero, that is eliminate, the difference between the sensing signal and the compensating signal whenever the power converter switch 608 is open.

Figure 8A:
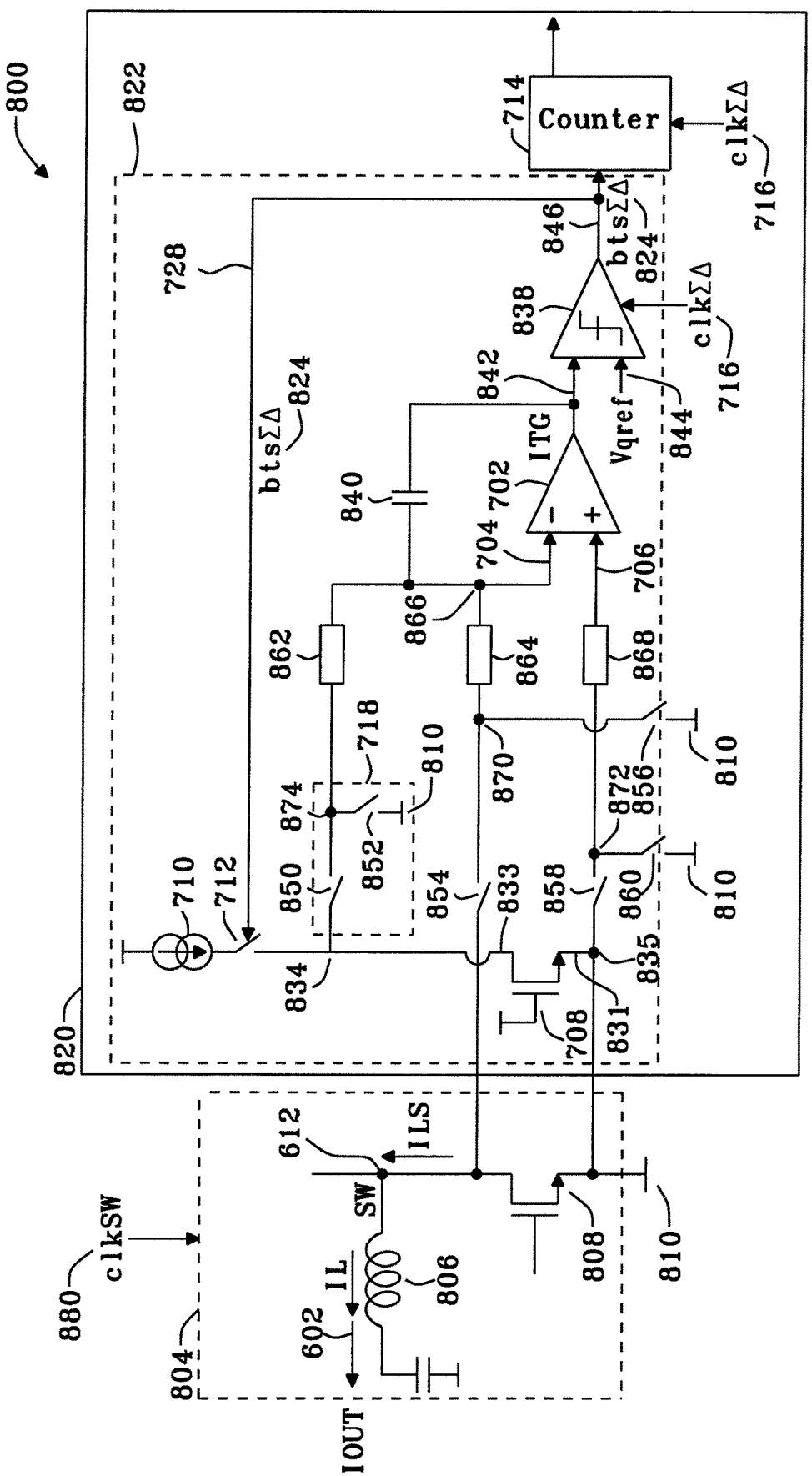
FIG. 8A is a schematic diagram showing a specific implementation of the system of FIG. 7.

FIG. 8A is a schematic diagram of a system 800 showing a specific implementation of the system 600 and according to a specific embodiment of the present disclosure. Common reference numerals and variables between Figures denote common features.

The system 800 may be used for example for sensing the output current 602 (IOUT) of a buck power converter 804. In an alternative embodiment the system may be used for sensing the input current of the buck power converter 804.

The buck converter 804 comprises a storage element, in this case an inductor, 806 (L) and a low side power converter switch 808 coupled at a switching node 612 (SW). The low side power converter switch 808 (hereinafter also referred to as "low side switch" for brevity) is arranged to selectively couple the inductor 806 to a ground voltage 810. The power converter 804 may also comprise a high side switch power converter switch (not shown) coupled to a high voltage supply (not shown).

The high side power converter switch (hereinafter also referred to as "high side switch" for brevity) and the low side switch 808 are operated such that when the high side switch is open the low side switch 808 is closed and when the low side switch 808 is open the high side switch is closed. In the following, D is used to refer to the duty cycle of the high side switch and 1-D is used to refer to the duty cycle of the low side switch 808.

In the specific example of a buck converter, IOUT=IL, that is, the current over the inductor 806 and the output current 602 of the buck converter 804 are the same current.

The system 800 comprises a current sensor 820 which is analogous to the current sensor 720B of FIG. 7B. The current sensor 820 comprises a pulse density modulator 822 analogous to the pulse density modulator 722B of FIG. 7B and configured to output a pulse modulated signal 824 (btsΣΔ). The pulse density modulated signal 824 is dependent on an average current $\overline{ILS}$ flowing through the low side switch 808 when the low side switch 808 is closed (on). In particular, the pulse density modulated signal 824 is proportional, or approximately proportional, to the average current ILS. More specifically, the pulse density modulated signal 824 provides a measurement of the average output current 602, which is $\overline{IOUT}=\overline{ILS}/(1-D)$.

The pulse density modulated signal 824 is a binary signal configured to be either in a logic 1 state or in a logic 0 state. The current sensor 820 comprises a counter 714 coupled to the pulse density modulator 822 and configured to count the number of pulses (N) in the signal 824 over a period of time Δt. The pulse density modulator 822 and the counter 714 are operated according to a clock signal 716 (clkΣΔ) and each clock cycle in which the first pulse density modulated signal 824 (btsΣΔ) is in the logic 1 state corresponds to a pulse.

The period of time Δt comprises a predetermined number ($N_{\Delta t}$) of clock cycles of the clock signal 716. For example, the period of time Δt may be 1 ms and the clock signal 716 may be configured such that 1 ms comprises 512 clock cycles; that is, the counter 714 counts the number of pulses N over 512 clock cycles.

The current sensor 820 is configured such that the number of pulses N over the time Δt is dependent on the average of the output current ($\overline{IOUT}$) over the predetermined period of time Δt, as will become evident from the following description. In particular, the current sensor 820 is configured such that the number of pulses N over the time Δt is proportional or approximately proportional to the average output current IOUT of the power switching converter over Δt.

The sensor current supply 710 comprises a current source coupled to the sensor switch 708 at a compensating node 834. The sensor current supply 710 is configured to provide a sensor current to the sensor switch 708, thereby generating a voltage VDAC at the node 834.

The return to zero switches 718 comprise a first return to zero switch 850 and a second return to zero switch 852. The switch 850 is configured to selectively couple a return-to-zero node 874 to the compensating node 834 while the switch 852 is configured to selectively couple the return-to-zero node 874 to the ground voltage 810. The return-to-zero node 874 is coupled to the first input 704 of the differential circuit 702. The differential circuit 702 may be for example an operational amplifier.

The sensor switch 708 has a first sensor terminal 831 coupled to the ground voltage 810 at a converter reference node 835 and a second sensor terminal 833 coupled to the compensating node 834. The current sensor 820 may be configured to always keep the sensor switch 708 closed (on) during operation of the system 800.

The pulse density modulator 822 further comprises a quantizer 838 and a capacitor 840. The capacitor 840 is provided on a feedback loop of the amplifier 702, such that the amplifier 702 and the capacitor 840 implement a signal integrator.

The quantizer 838 has a first quantizer input 842 coupled to the output of the amplifier, a second quantizer input 844 coupled to a quantizer reference voltage Vqref and a quantizer output 846 for providing the pulse density modulated signal btsΣΔ. The pulse density modulator 822 further comprises the DAC switch 712 coupled to the quantizer output 846 and to the current source 710.

The pulse density modulator 822 comprises a first coupling switch 854 and a second coupling switch 856 for selectively coupling the first input 704 to the switching node 612; and the pulse density modulator 822 comprises a third coupling switch 858 and a fourth coupling switch 860 for selectively coupling the second input 706 to the converter reference node 835.

The pulse density modulator 822 may also comprise a first resistor 862 coupled to the return to zero switches and to the first input 704; and a second resistor 864 coupled to the coupling switches 854 and 856 and to the first input 704, where the first input 704, the first resistor 862 and the second resistor 864 are coupled at a node 866 (NR); and the second resistor 864, the switch 854 and the switch 856 are coupled at a sensing node 870.

Additionally, the pulse density modulator 822 may comprise a third resistor 868 having a first terminal coupled to the second input 706 and second terminal coupled to the switches 858 and 860 at a second sensing node 872. The third resistor 868 may be selected such that it matches the parallel impedance of the first resistor 862 and the second resistor 864.

In this embodiment, the sensing signal is given by the voltage difference between the first sensing node 870 and the second sensing node 872; and the compensating signal is given by the voltage difference between the return to zero node 874 and the converter reference node 835.

When the low side switch 808 is open, the switch 854 and the switch 858 are open, while the switch 856 and the switch 860 are closed, such that the first input 704 is only coupled to the switching node 712 during the duty cycle of the low side switch 808; and the second input 706 is only coupled to the converter reference node 835 during the duty cycle of the low side switch 808. When the low side switch 808 is open, the first input 704 and the second input 706 are both coupled to the ground voltage 810.

In operation, the amplifier 702 is configured to maintain an average difference between the first input 704 and the second input 706 at zero. Since the input 706 is coupled to the ground voltage 810, then on average the input 704 is also on average equal or approximately equal to the ground voltage 810. As a consequence, when a voltage other than the ground voltage 810 is generated at the return to zero node 874 (i.e. the compensating signal is not zero), a current flows into the resistor 862. Similarly, whenever a voltage is provided at the node 870 other than the ground voltage 810 (i.e. the sensing signal is not zero), a current flows through the resistor 864. Said currents flow into capacitor 840 so that they are integrated over time.

In particular, at startup the voltage at the compensating node 834 and the voltage at the return to zero node 874 are zero (compensating signal is zero). The voltage difference between the first sensing node 870 and the second sensing node 872 is equal or approximately equal to the voltage drop VDS across the low side switch 808. In particular, since ILS is flowing from ground to the switching node 612, the sensing signal will be negative. For example, the voltage at the second input 706 may be 0 mV and the voltage at the first input 704 may be −50 mV (for RDSON=10 mOhms and ILS=5 A). Then the amplifier 702 receives in input a negative differential signal and generate an increasing current at its output (ITG).

The quantizer 838 compares the voltage at the first quantizer input 842 with the quantizer reference voltage Vqref and outputs a pulse whenever the voltage at the first quantizer input 842 exceeds the quantizer reference voltage Vqref.

The DAC switch 712 is configured such that when the pulse density modulated signal 624 output by the quantizer 838 is in the logic 1 state, the DAC switch 712 is closed and the DAC switch 712 provides a current path for the sensor current to flow through the sensor switch 708; and, when the pulse density modulated signal 624 output by the quantizer 838 is in the logic 0 state, the DAC switch 712 is open.

Hence, when a pulse is generated at the output of the quantizer, the DAC switch 712 is turned on and a current source IDAC flows into the sensor switch 708.

A voltage VDAC is then provided at the node 834. The compensating voltage VDAC is equal to a voltage difference between the first sensor terminal 831 and the second sensor terminal 833 of the sensor switch 708. If the sensor switch 708 is selected to have an internal resistance RDSON×k, as previously discussed, then: VDAC=RDSON×k×IDAC.

The voltage VDAC counter-balances the negative sensing signal. The difference between the first input 704 and the second input 706 then gradually becomes positive and the amplifier 702 decreases the current ITG such that the output of the quantizer 838 goes to (logic) 0.

When the low side switch 808 is closed, the switch 854 and the switch 858 are closed; and the switch 856 and the switch 860 are open. Hence when the low switch 808 is off the difference between the first input 704 and the second input 706 is zero.

The low side 808 switch continues to switch on and off, and the switches 854, 856, 858, 860 are controlled according to the same switching frequency such that the current ILS flowing through the switch 808 is averaged by the operational amplifier integrator.

The current sensor 820 is further configured to control the switches 850 and 852 such that when the low side switch 808 is closed, the switch 850 is closed and the switch 852 is open; and, when the low side switch 808 is open, the switch 850 is open and the switch 852 is closed. This way, when the low switch 808 is closed, the return-to-zero node 874 is coupled to the voltage VDAC and when the low switch 808 is open the return-to-zero node 874 is coupled to the ground voltage 810. In particular, when the low side switch 808 is closed, the differential signal and the compensating signal are both zero.

The low side switch 808 may be controlled according to a power converter clock signal 880. The current sensor 820 may be configured to receive a one or more drive signals from the power converter indicative of when the switch 808 is ON/OFF and control the closing and opening of one or more of the switches 850, 852, 854, 856, 858, 860 based on said drive signal(s). In addition or in alternative the current sensor 820 may be configured to receive the clock signal 880 and control (open/close) one or more of the switches 850, 852, 854, 856, 858, 860 according to said clock signal.

The pulse density modulator 822 of the system 800 substantially works as a sigma delta modulator, albeit an unconventional one.

If the current ILS were on average equal to the current IDAC through the sensor switch 708, then the pulse density modulator 822 would only need to generate logic 1s (pulses) at the output of the quantizer (i.e. btsΣΔ would always be in the logic high state) to compensate the differential signal seen by the amplifier 702. If the current ILS were on average 0 A, the pulse density modulator 822 would need to generate only logic 0s (i.e. btsΣΔ would always be in the logic low state).

The number of pulses N generated by the pulse density modulator 822 "tracks" the history of the average current $\overline{ILS}$ (and consequently of $\overline{IOUT}$).

The sigma delta modulator 822 always adjusts the number of pulses output in the PDM signal 824 in order to try to zero the difference at its inputs.

As previously discussed, the sensor switch 708 can be chosen such that it has an internal resistance equal or approximately equal to the internal resistance of the low side switch 808 multiplied by a scaling factor k. That is, if the low side switch has an internal resistance RSDON, the sensor switch 708 is selected such that it has an internal resistance RSDON*k. Similarly, the current supply 710 can be chosen such that the current IDAC is equal or approximately equal to the full-scale current IFS of the switching power converter 804 divided by the same scaling factor k.

In preferred embodiments, the current source 710 is configured such that the current IDAC is equal or approximately equal to (IFS+OH)/k, where IFS is an estimate of the full-scale current, i.e. the maximum average current, generated by the switching power converter 804 and OH is an overhead amount added to ensure stability of the pulse density modulator 822. For example, OH may be a 25% overhead such that, if it is estimated that the maximum average output current of the switching power converter 804 will be 4 A, then the current supply 710 may be configured to provide a current IDAC=5 A/k.

The factor k may vary from embodiment to embodiment. As a non-limiting example, the factor k may be 1000, 2000 or 20000. The larger the factor k, the smaller the current supply 710 and the sensor switch 708, which in turn allows for smaller implementation area, lower consumption and lower costs.

The voltage drop VLS across the terminal of the low side switch 808 is equal or approximately equal to the current ILS flowing through the low side switch 808 multiplied by the internal resistance of the switch 808, that is:

$$VLS = ILS \times RDSON$$

Over a period Δt, the low side switch 808 is opened and closed according to the duty cycle (1–D), hence $\overline{IOUT} = \overline{ILS}/(1-D)$ and the average over Δt of the voltage difference VDS between the first sensing node 870 and the second sensing node 872 is:

$$\overline{VDS} = \overline{ILS} \times RDSON = \overline{IOUT} \times RDSON \times (1-D).$$

On the other hand, the average over Δt of the voltage VDAC at the node 834 will be given by the voltage drop across the sensor switch 708 multiplied by the fraction of pulses in the period of time Δt, that is:

$$\overline{VDAC} = IDAC \times RDSON \times k \times \frac{N}{N_{\Delta t}}$$

where N is the number of 1 s (pulses) in the period of time Δt, and $N_{\Delta t}$ is the number of clock cycles of the clock signal 716 in the period of time Δt.

The return-to-zero switches 850 and 852 are configured to selectively isolate the return-to-zero node 874 from the signal VDAC when the low-side switch is off, so that on average the contribution of the voltage VDAC to the compensating signal is reduced by a factor (1–D); that is, the voltage VRTZ at the node 874 is $$\overline{VRTZ} = \overline{VDAC} \times (1-D).$$

Since the pulse density modulator 822 is configured to try and zero its differential input, then:

$$\overline{VDS} = \overline{VRTZ} = \overline{VDAC} \times (1-D)$$

from which it follows that over a period Δt:

$$\overline{VDS} = RDSON \times k \times IDAC \times \frac{N}{N_{\Delta t}} \times (1-D)$$

and $$\overline{IOUT} = IDAC \times k \times \frac{N}{N_{\Delta t}}.$$

As previously discussed, IDAC may be chosen such that IDAC=(IFS+OH)/k so that $$\overline{IOUT} = (IFS + OH) \times \frac{N}{N_{\Delta t}}.$$

The number of pulses N "records" the history of the average current IOUT. With a sigma delta modulator (822) and just two switches (850, 852) the above system 800 allows to obtain a bit-stream which reflects the average inductor current IL, that is, the average output current of the switching power converter 804.

The above description relates to an ideal scenario in which there are no delays when a switch is turned on/off. However, in real system, the low side switch 808 may take some time to stabilize and therefore the system 800 may be configured such that the switches 850, 854, 856 and the switches 852, 858, 860 may be switched respectively on/off with a slight delay as compared to the time at which the low side switch 808 is switched on; and, the switches 850, 854, 856 and the switches 852, 858, 860 may be switched respectively off/on with a slight advance as compared to the time at which the low side switch 808 is switched off.

Figure 9:
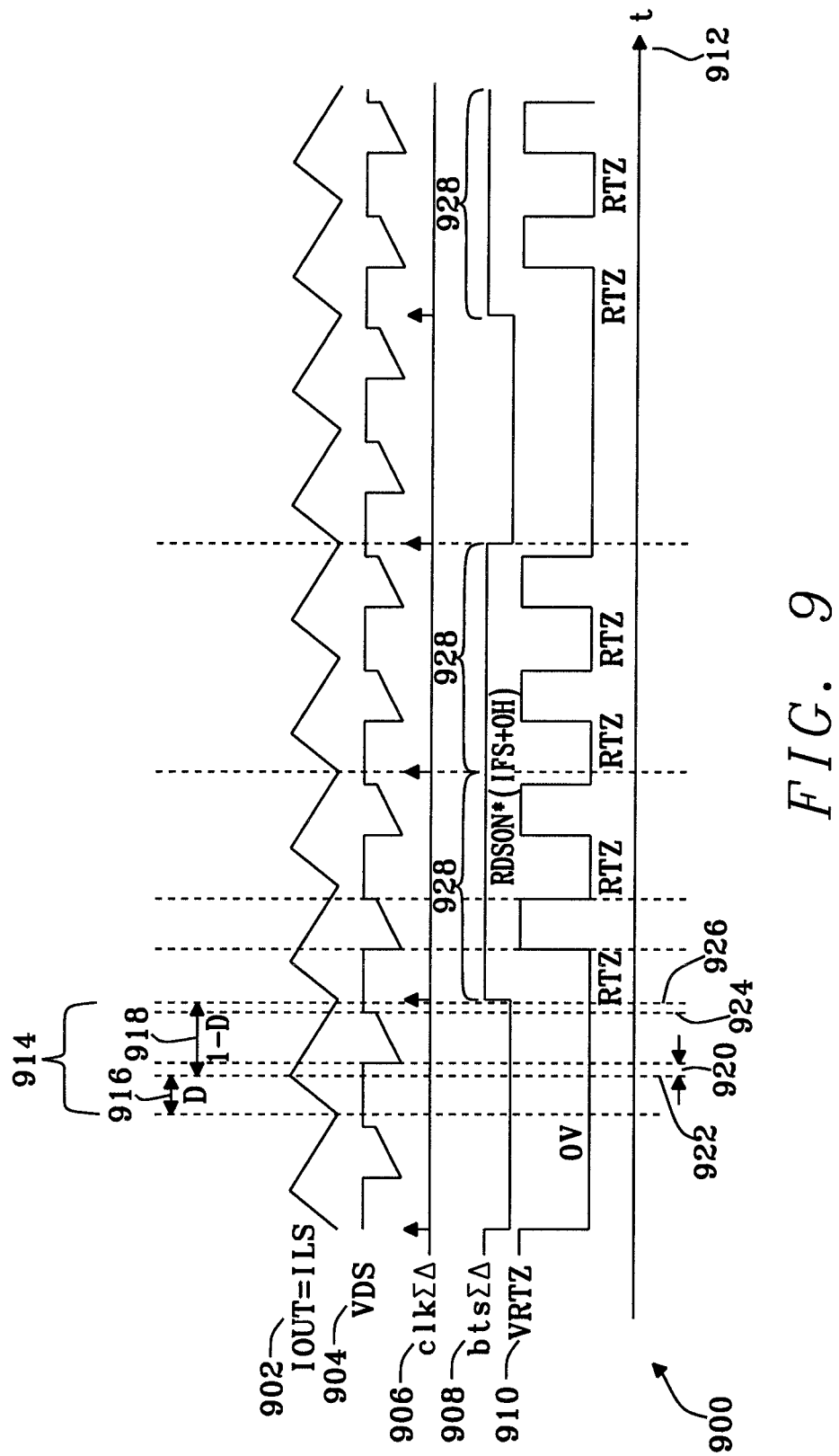
FIG. 9 is a timing diagram showing an operation of the system of FIG. 8A.

FIG. 9 is a timing diagram 900 showing an operation of the system 800 of FIG. 8A. In this specific example the power converter 804 is operated in the so-called pulse width modulation (PWM) mode.

The horizontal axis 912 represents the time over which the various signals of the time diagram 900 are evolving. The lineplot 902 shows the current flowing through the inductor 806 (IL). The lineplot 904 shows the sensing signal VDS. The lineplot 906 shows the clock signal 716 (clkΣΔ) of the pulse density modulator 822 and the counter 714. The lineplot 908 shows the pulse density modulated signal 824 (btsΣΔ). The lineplot 910 shows the compensating signal (voltage at the return-to-zero node 874 VRTZ with respect to the ground voltage 810).

In this specific example, the clock signal clkΣΔ (716) has a frequency equal to half the frequency of the power converter clock signal 880.

Within a clock cycle 914 of the switching clock signal 880, the low side switch 808 is closed for a duty time 1–D and open for the remaining time D.

As shown in FIG. 9, the switches 850, 854, 858 and the switches 852, 856, 860 are closed and opened respectively with a slight delay relative to the time at which the low side switch 808 is opened, meaning that the sensing signal VDS (904) drops with a slight delay 920 with respect to the time 922 at which the inductor current starts decreasing. In ideal embodiments, the delay 920 will be zero.

Similarly, the switches 850, 854, 858 and the switches 852, 856, 860 are respectively opened and closed with a slight advance time relative to the time at which the low side switch is opened, meaning that the sensing signal VDS is reset to zero at an earlier time 924 with respect to the time 926 at which the inductor current stops decreasing. In other words, in real embodiments the duty cycle (1–D') of the switches 850, 852, 854, 858, 856, 860 is slightly shorter than the duty cycle (1–D) of the power converter switch 808 to account for non-idealities.

In the example of FIG. 9, it can also be seen that, other than for the short time delays and advances due to the non-ideality of the low-side switch 808, for each pulse 928 of the pulse modulated signal 908, the compensating VRTZ signal is only high when the low side switch is open and it is low when the low side switch is closed.

The average of the VRTZ signal across each pulse is RDSON*(IFS+OH)*(1–D').

Embodiments of the systems described herein have various advantages over the prior art since they avoid the burden of long time-constant averaging in analog, by using a mixed-signal averaging. With reference to FIG. 8A, for example, the sigma-delta modulator 822 continuously generates a bit-stream proportional or approximately proportional to the average current ILS and IOUT in the low-side switch 808. When ILS is higher, the bit-stream generates more '1'. When ILS is lower, the bit-stream generates more '0'. A simple counter over a short predetermined time, e.g. 1 ms, is enough to integrate the history of ILS contained in the bit-stream. The sigma delta modulator operates continuously in time. This achieves the second-part of the averaging: the continuous-time integrator of the sigma delta modulator (amplifier 702 and capacitor 840) absorbs/tracks any shape of ILS (in other words, it performs the high-frequency part of the averaging); and the bit-stream output by the quantizer records the average ILS (IOUT) over the predetermined time (in other words, it performs the low-frequency part of the averaging).

Because continuous-time sigma-delta modulators do not need a fast operational amplifier like their switched-capacitor counterparts, continuous-time sigma-delta modulators can operate at low currents and therefore are particularly well-suited for continuous current monitoring.

Moreover, the systems and methods of the present disclosure use a return-to-zero technique which is normally used to improve the jitter immunity for continuous time sigma delta modulators to account for the duty cycle of the power converter switch. This means that a measure of the average output current IOUT over the whole switching cycle can be obtained by simply adding two switches (e.g. 850, 852).

The systems and methods of the present disclosure allow to achieve very high accuracy with minimum currents. Prior art systems require high (at least >100 µA) currents to achieve the same level of performance, whereas the systems and method of the present disclosure can work with <10 µA.

Additionally, the calibration of the systems of the present disclosure is simplified compared to the prior art. Only two points need to be tested to extract the offset and gain of the amplifier and the calibration compensation can then be done in the digital domain. Choppers are also easy to introduce with the methods and systems of the present disclosure and may dramatically reduce the offset and off-load the trimming effort required for calibrating the amplifier in prior art systems.

Lastly, the methods and systems of the present disclosure have the advantage of not requiring an ADC as in the prior art system. This can instead be replaced by a basic low-consumption counter.

Figure 8B:
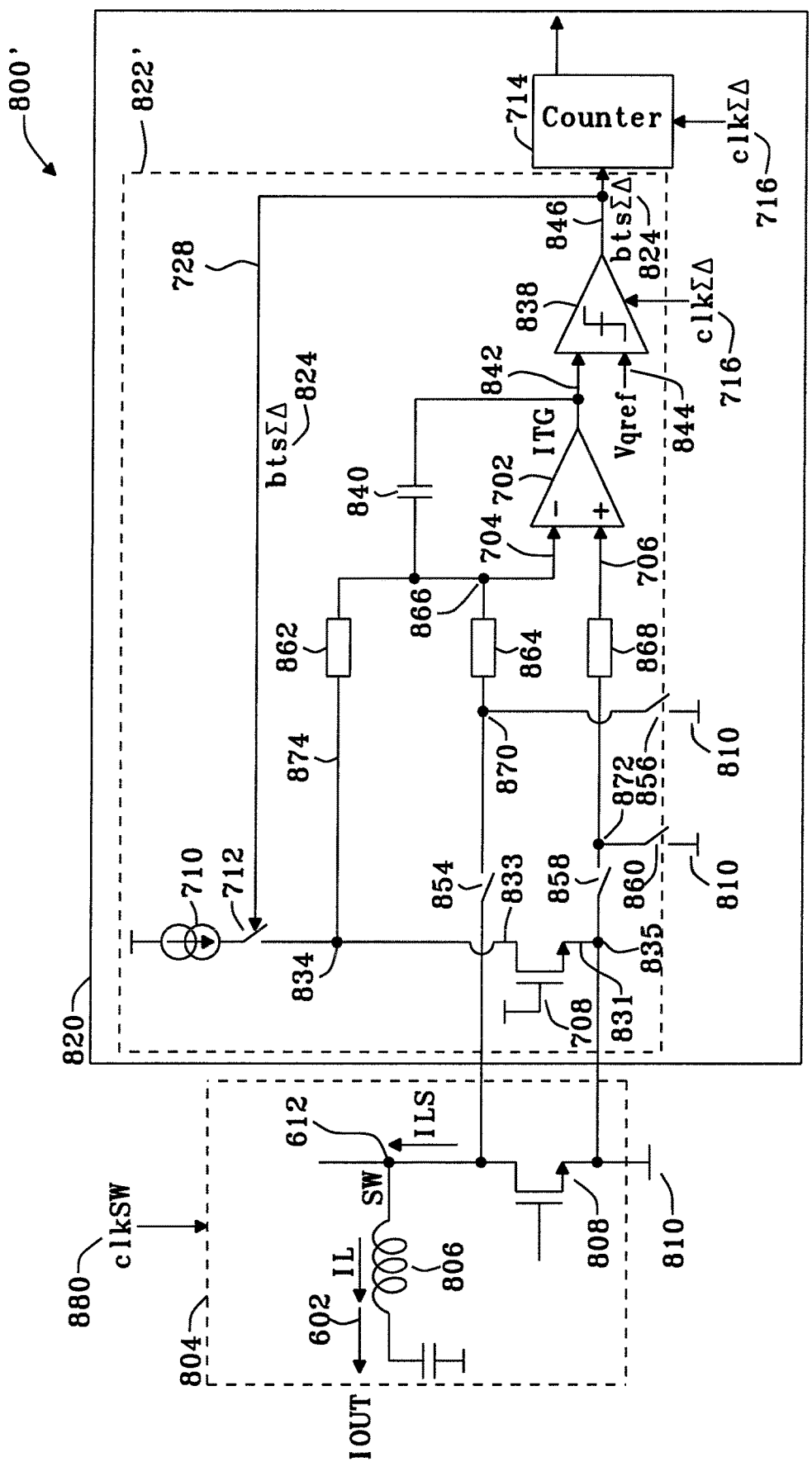
FIG. 8B is a schematic diagram showing a modification of the system of FIG. 8A for use with power converters operated in pulse frequency mode.

In some cases, a power converter may be operated in the so-called pulse frequency mode, in which case the current IL over the energy storage element 806 comprises discrete pulses, as opposed to having the sawtooth profile which is typical of the pulse width modulation mode of operation. In this case, a modified version 800' of the embodiment would be needed for sensing the current IOUT since it would not be possible to synchronize the sigma delta clock clkΣΔ to the IL current pulses and therefore it would not be possible to use the return-to-zero switches 850-852. A schematic diagram of such embodiment is shown in FIG. 8B. In this case the compensating signal is equal to the difference between the voltage at the compensating node 834 and the ground voltage 810 and the output of the PDM does not provide a direct measure of the average current $\overline{IOUT}$, but rather a measure of the average current through the low side switch.

Then, a division by (1−D), the duty cycle of the low side switch, may be implemented in the digital domain in order to obtain the output current $\overline{IOUT}$ from the measurement of the modified pulse density modulator 822'. This is illustrated in FIG. 10.

Figure 10:
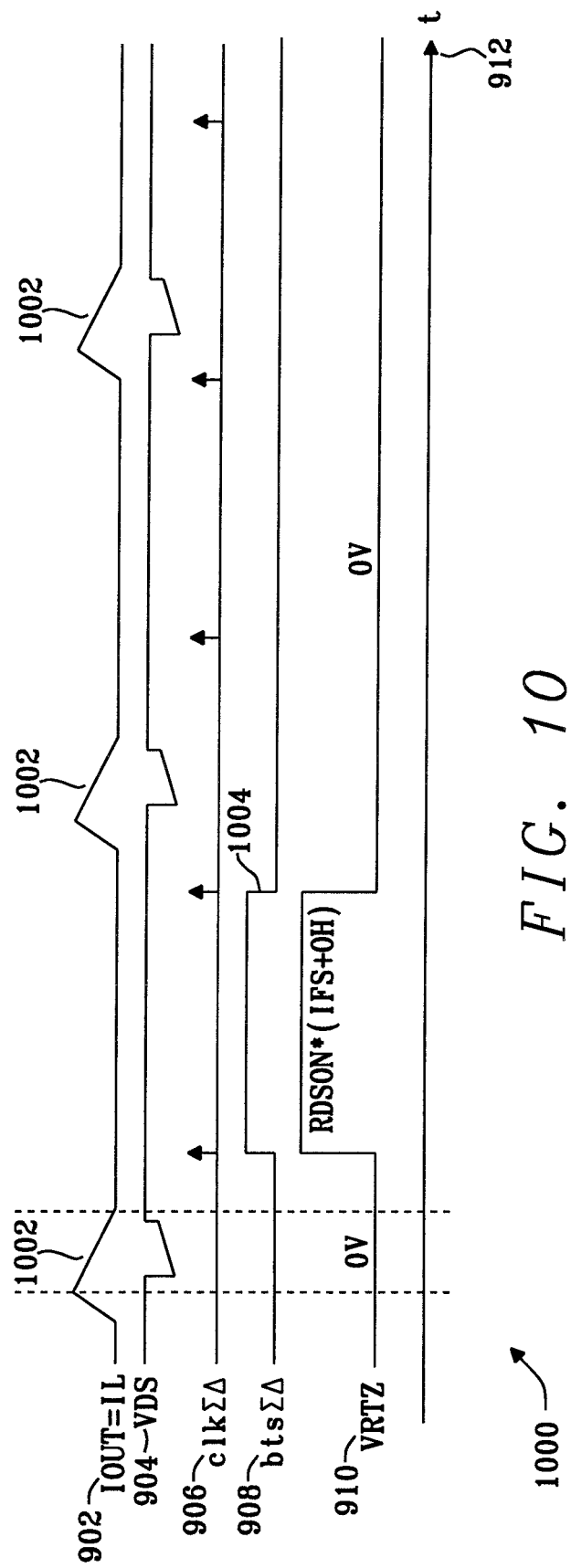
FIG. 10 is a timing diagram showing an operation of the system of FIG. 8A adapted for use with a power converters operated in pulse frequency mode.

FIG. 10 is a timing diagram 1000 showing an operation of the system 800 adapted for use with a power converter operated in pulse frequency mode. Common reference numerals and variables between Figures denote common features.

Pulse frequency mode is a well-known mode of operation of DC-DC power converter suitable for light loads. When the converter 804 is operated in pulse frequency mode, the current IL over the inductor 806 comprises discrete pulses 1002, as opposed to having the sawtooth profile which is typical of pulse width modulation mode of operation.

The clock signal 716 (clkΣΔ) of the sigma delta modulator is not synchronized with the current pulses, as shown in the lineplot 906 of FIG. 10. So, it is not possible to use the return-to-zero switches 850-852 because the pulse density modulated signal btsΣΔ may comprise pulses 1004 at any time over the switching cycle of the low side/high side switch of the power converter. The same system could be used without the switches 850-852. In this case the measurement of the system would provide a correct estimate of the average current ILS flowing through the low side switch 808 and this could be corrected in the digital domain by dividing it for (1−D) in order to obtain the average inductor current IL=$\overline{IOUT}$=$\overline{ILS}$/(1−D).

This may also apply to embodiments for use with power converters which are operated in the pulse width modulation mode. However, it will be appreciated that the operation of dividing by (1−D) in the digital domain would introduce a larger error when compared to the return-to-zero technique implemented in the system 800 of FIG. 800, and the accuracy of the measurement may not be within the desired +/−5% range.

Figure 11:
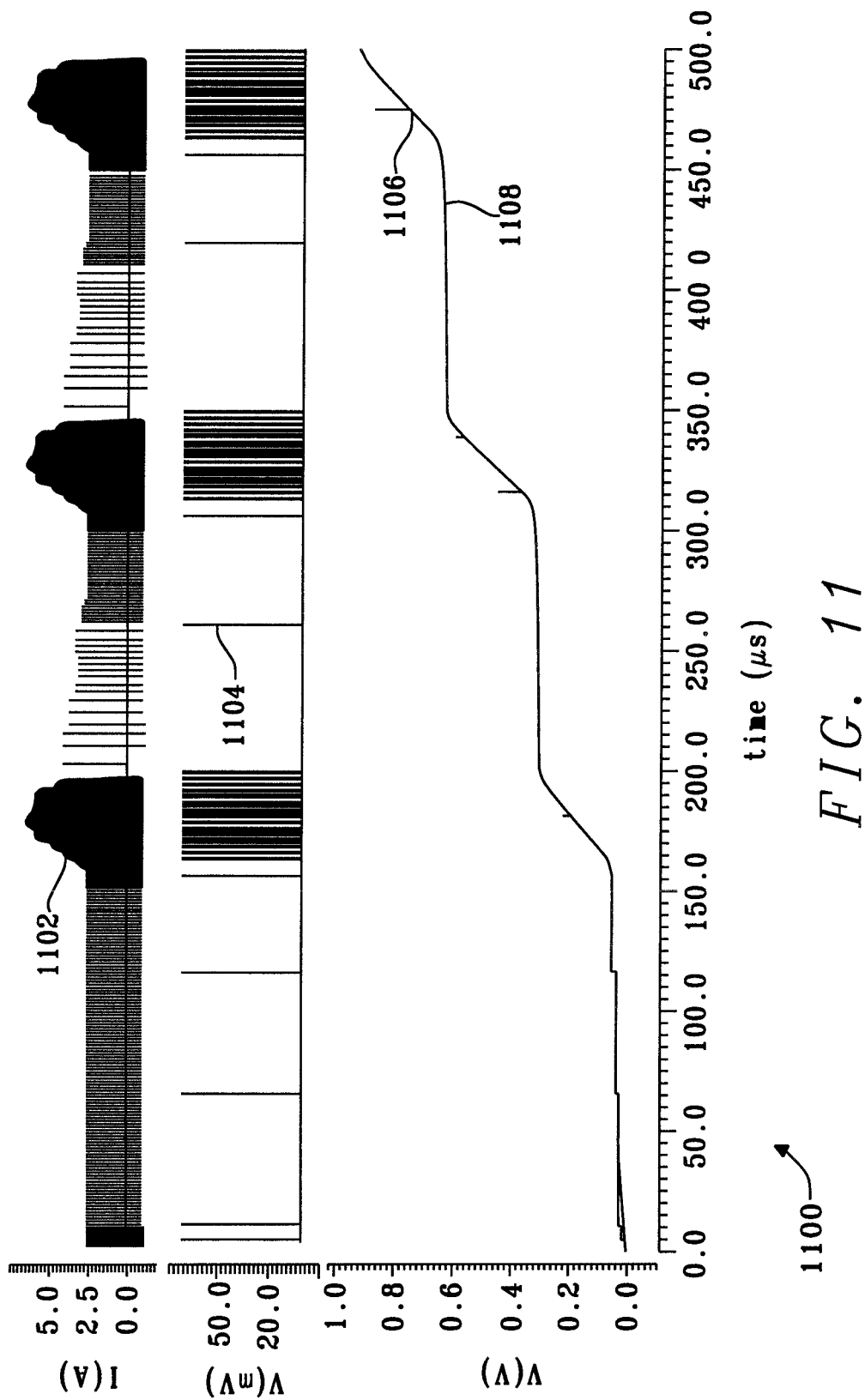
FIG. 11 is a graph showing the results of a simulation for the system of FIG. 8A.

FIG. 11 is a graph showing the results of a simulation for the system 800 of FIG. 8A in use with a low side switch of a buck power converter.

In particular, in this simulation the mode of operation of the buck power converter was alternated between pulse width modulation mode (PWM) and pulse frequency modulation mode (PFM).

The lineplot 1102 is the current through the inductor 808 (IL), from which the two different modes of operations can be seen.

The lineplot 1104 is the pulse density modulated signal btsΣΔ (824).

The lineplot 1106 represents the cumulative number of pulses in the pulse density modulated signal btsΣΔ and the line 1108 represents the simulated integral vale of the average output current IOUT. In particular, the lineplot 1106 is N/$N_{Af}$×IFS. For this simulation, $N_{Af}$=512.

As shown in FIG. 11, the measurement derived from the pulse density modulated signal is very accurate and exhibits an error which is <5%.

Figure 12:
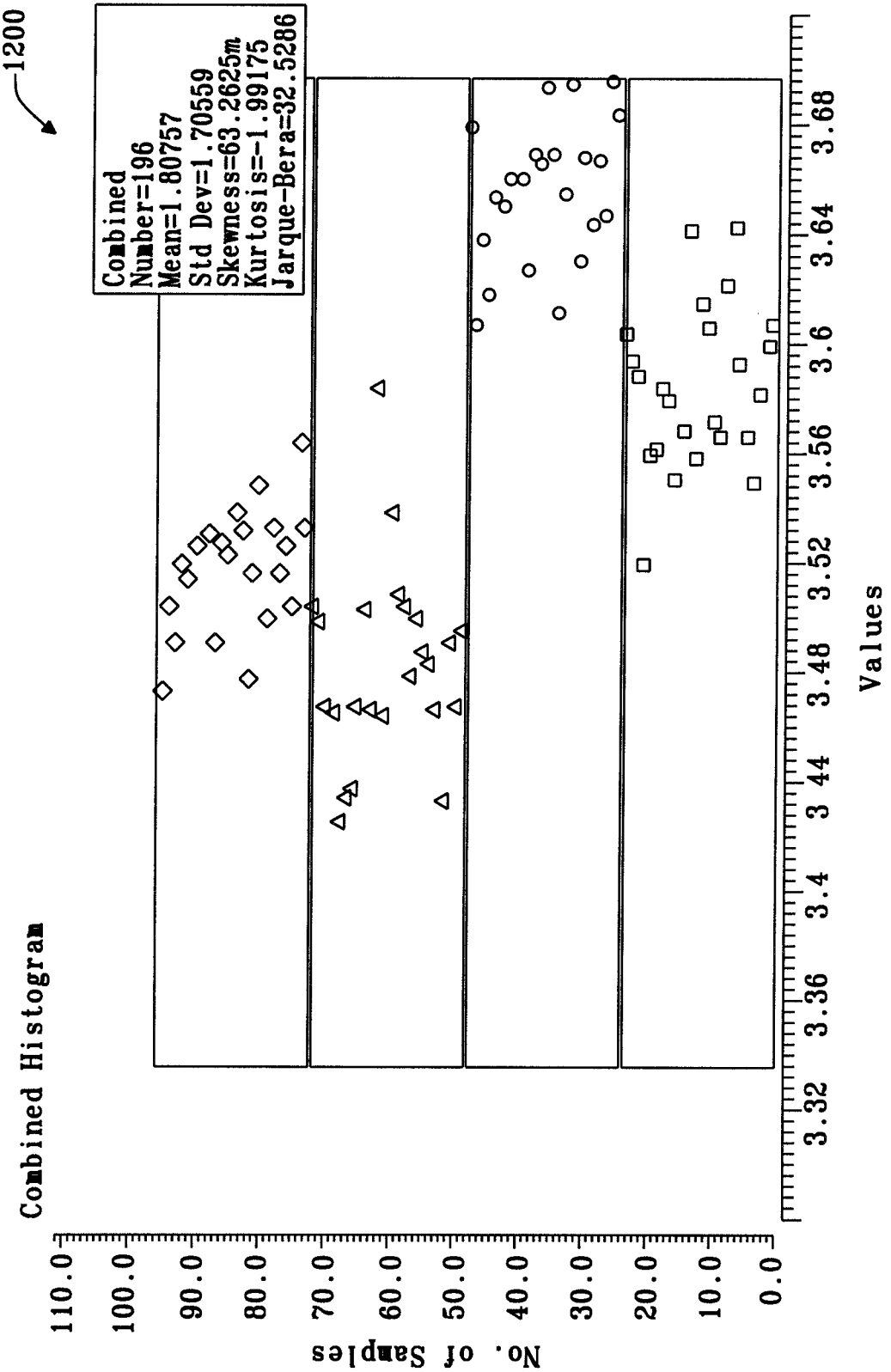
FIG. 12 is a graph showing the results of a simulation illustrating the accuracy of systems according to the present disclosure.

FIG. 12 is a graph showing the results of a simulation illustrating the accuracy of the system according to the present disclosure.

For this simulation, a power converter configured to output a constant current IL=IOUT=3.5 A was considered. The IDAC current (IFS+OH) was set to 6 A and the scaling factor k was set to 20000.

The full transistor implementation of the system 800 was simulated for voltages VIN in the range (2.7V to 5.5V and for temperature between −40 degree Celsius and 125 degree Celsius), with the buck power converter being simulated in closed-loop and taking into account the parasitic impedances on ground connections (0.5 nH; 2 mOhm).

By Monte-Carlo simulation (process & mismatch) the history of the current IOUT was captured at a rate of 2 kS/s, meaning that a 9-bit sample is captured every 512 µs, where the 9-bit sample is the number of '1' counted by the counter over the 512 cycles (each cycle being 1 µs).

The simulation results in FIG. 12 show that there is a maximum deviation of +/−4% from the ideal 3.5 A result and the system only consumes 7 µA nominally when IL=0, so it can be left always on.

Figure 13:
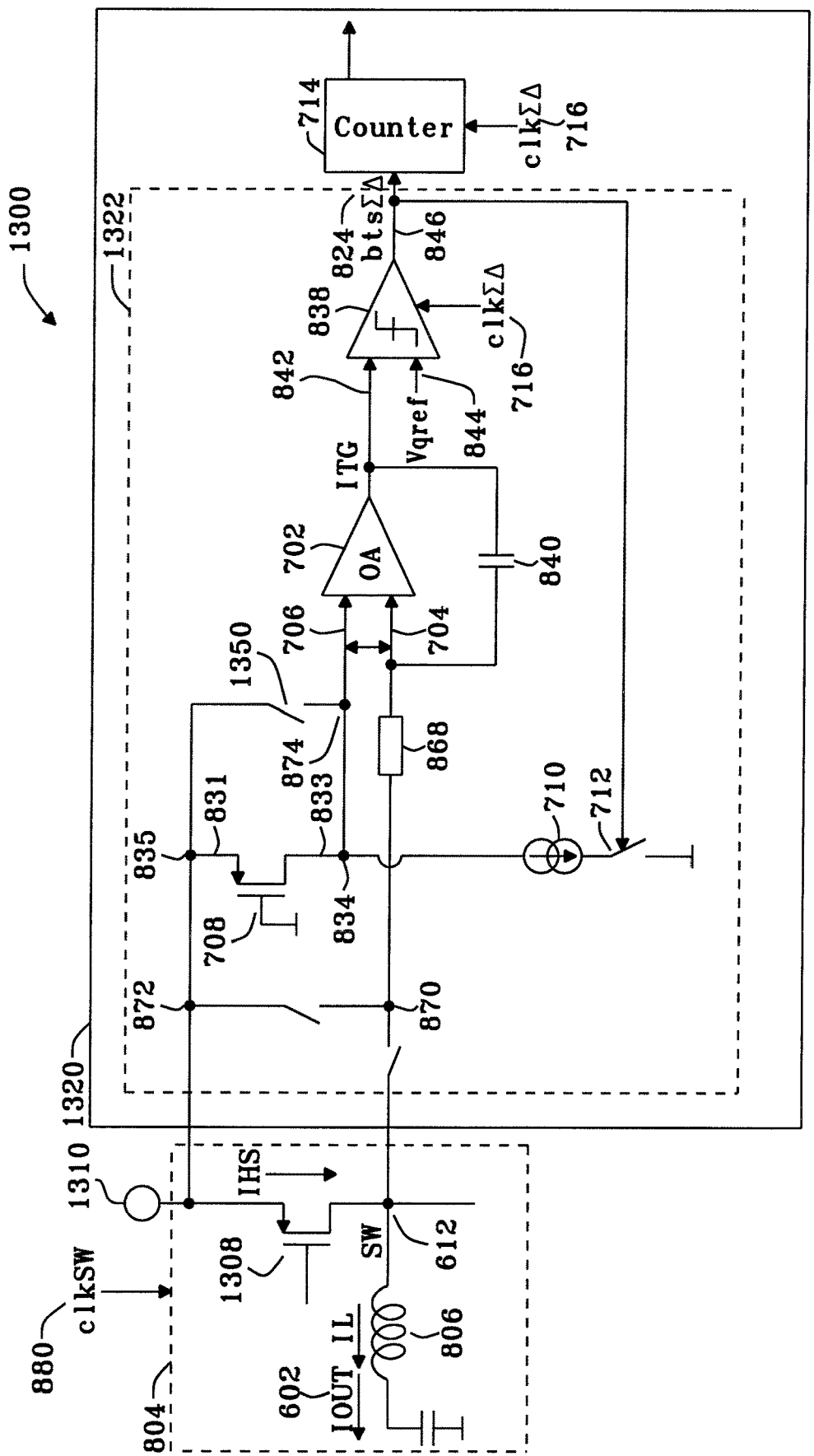
FIG. 13 is a schematic diagram showing a further specific implementation of the system of FIG. 6.

The system 800 of FIG. 8A comprises a current sensor 820 configured to measure the output current by measuring the average current flowing through the low side switch. However, it will be appreciated that an analogous current sensor may be implemented for measuring the current flowing through the high side switch. This is illustrated in FIG. 13. In an alternative embodiment, the system 800 may comprise a current sensor configured to measure the input current by measuring the average current flowing through the low side or high side switch.

FIG. 13 is a schematic diagram of a system 1300 showing a further specific implementation of the system 600 and according to a specific embodiment of the present disclosure. Common reference numerals and variables between Figures denote common features.

The buck converter 804 comprises an inductor 806 (L) and a high side switch 1308 coupled at a switching node 612 (SW). The high side switch 1308 is arranged to selectively couple the inductor 806 to a first voltage 1310, which may be referred to as a converter reference voltage 1310, or VIN.

Corresponding numerals between FIG. 13 and FIG. 8A represent corresponding components. For example, the system 1300 comprises a current sensor 1320 which corresponds to the current sensor 820 of FIG. 8A. The current sensor 1320 comprises a pulse density modulator 1322 which corresponds to the pulse density modulator 822 of FIG. 8A and so on.

The pulse density modulator 1322 is configured such that it continuously tries to balance the voltage difference between the nodes 872 and the node 870 with the voltage signal generated at the node 874. In this case the voltage difference between the nodes 872 and the node 870 is given by $$\overline{IHS} \times RDSON = \overline{IOUT} \times RDSON \times D,$$

where $\overline{IHS}$ is the average current through the high side switch 1308 and D is the duty cycle of the high side switch 1308.

Only one return-to-zero switch 1350 is needed for reducing the compensating signal by a factor equal to the duty cycle D of the high side switch such that the signal output by the pulse density modulator takes into account the time during which the high side switch is open and no current is output by the switching power converter. The return to zero switch 1350 selectively couples the two terminals 831 and 833 of the sensor switch 708 so that when the switch 1350 is closed no compensating signal is seen by the amplifier 702 from the current source 710.

It will be appreciated that although one of the main advantages of the systems and methods of the present disclosure is that it allows to obtain a very accurate measure of the output current or the input current of the switching power converter by sensing the current of only one of the high side or low side switch, it is in principle possible to use two current sensors, one for the low side switch and one for the high side switch. In some embodiments the system 600 may comprise both a current sensor configured to sense the current through the low side switch, such as the current sensor 820; and, a current sensor configured to sense the current thought the high side switch, such as the current sensor 1320. In such embodiments, the system 600 may be configured to combine a measurement provided by the current sensor 820 and a measurement provided by the current sensor 1320 such that the system 600 provides an accurate measurement of the output current or the input current of the power converter throughout the whole switching cycle of the power converter. However, this would of course results in larger implementation area, higher costs and higher consumption.

As mentioned previously, the system and methods of the present disclosure may also work with other types of power converters and not just with a buck converter. A further example, is described herein, relating to a system which may be used for sensing the output current or the input current of a buck-boost converter.

Figure 14:
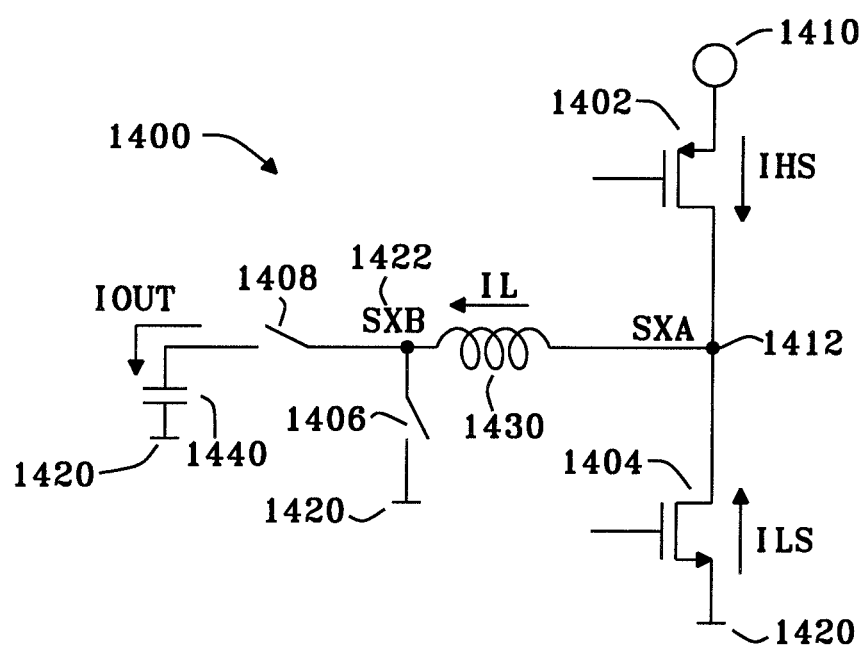
FIG. 14 is a schematic diagram of a power stage of a buck-boost converter according to the prior art.

FIG. 14 is a schematic diagram of a buck-boost converter according to the prior art.

The buck-boost converter comprises a voltage 1410, a voltage 1420, a capacitor 1440 and an inductor 1430.

The buck-boost converter further comprises a buck high switch 1402, a buck low side switch 1404, a boost low-side switch 1406 and a boost high-side switch 1408. The buck high side switch 1402 and the buck low side switch 1404 are coupled at a first switching node 1412 (SXA). The boost low side switch 1406 and the boost high side switch 1408 are coupled at a second switching node 1422 (SXB).

The inductor 1430 is coupled between the first switching node 1412 and the second switching node 1422. The capacitor 1440 is coupled between the boost high side switch 1408 and the voltage 1420.

In operation, the buck-boost converter 1400 is configured such that when the boost low side switch 1406 is on, the boost high side switch 1408 is off and vice-versa. The buck-boost converter is configured to, during a duty cycle of the buck high side switch 1402, alternatively switch on and off the switches 1406 and 1408 in order to selectively couple the inductor 1430 to the capacitor 1440 or to the voltage 1420.

The duty cycle of the boost low side switch 1406 may be referred to as DO. That is, in operation, the boost low side switch 1406 is on for a fraction of time DO and the boost high side switch 1408 is on during a fraction of time 1−DO. Consequently, the average output current IOUT is equal or approximately equal to the average current IL flowing through the inductor L 1430 multiplied by a factor (1−DO):

$$\overline{IOUT} = IL \times (1-DO).$$

Figure 15:
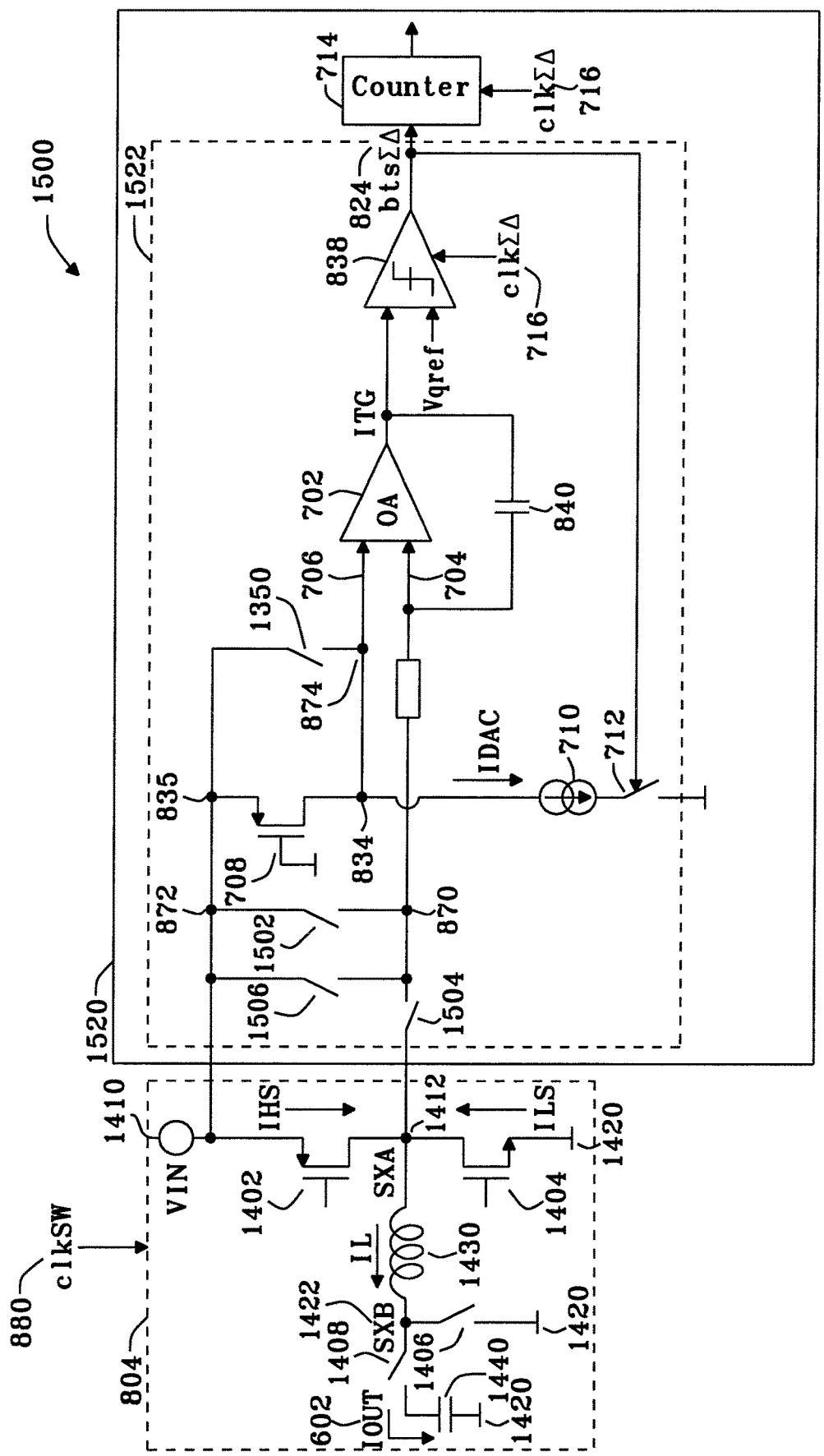
FIG. 15 is a schematic diagram showing a further specific implementation of the system of FIG. 6.

FIG. 15 is a schematic diagram of a system 1500 showing a further specific implementation of the system 600 and according to a specific embodiment of the present disclosure. Common reference numerals and variables between Figures denote common features.

The system 1500 is configured to sense an output current of the buck boost converter 1400 of FIG. 14. In an alternative embodiment, the system may be configured to sense an input current of the buck boost converter 1400 of FIG. 14.

The system 1500 comprises a current sensor 1520 comprising a pulse density modulator 1522 which is largely analogous to the pulse density modulator 822 and 1322 of FIGS. 8A and 13. A detailed description of said pulse density modulator will not be repeated.

The pulse density modulator 1522 comprises a first return-to-zero switch 1350 and a second return-to-zero switch 1502. Moreover, the pulse density modulator 1522 comprises a first coupling switch 1504 and a second coupling switch 1506 for selectively coupling the first sensing node 870 to the switching node SXA (1412) or to the voltage VIN (1410).

The current sensor 1520 is configured such that: when the buck high side switch 1402 is closed, the first coupling switch 1504 is closed and the second coupling switch 1506 is opened; when the buck high side switch 1402 is opened, the first coupling switch 1504 is opened and the second coupling switch 1506 is closed.

Hence, the voltage difference between the first sensing node 872 and the second sensing node 870 (i.e. the differential sensing signal VDS) is on average $\overline{VDS} = RDSON \times \overline{IL} \times D$, where D is the duty cycle of the high side switch.

The sigma delta modulator 1522 will, again, generate a pulse density modulated signal configured such that the average voltage VDS matches the average voltage VRTZ at the return to zero node 874: $\overline{VRTZ} = \overline{VDS}$.

The pulse density modulator 1522 is further configured such that the first return-to-zero switch 1350 is closed when the buck high side switch 1402 is opened and it is opened when the buck high side switch 1402 is closed.

Moreover, the pulse density modulator 1522 is configured such that the second return-to-zero switch 1502 is closed when the boost high side switch 1408 is opened (boost low side switch 1406 is closed); and the switch 1502 is opened when the boost high side switch is closed (boost low side switch 1406 is opened).

In operation, the first return to zero switch 1350 allows to correct the differential compensating signal to account for the duty cycle of the buck high side switch; and the second first return to zero switch 1502 allows to correct the differential sensing signal to account for the duty cycle of the boost low side switch.

Hence the first and second return to zero switches allow to selectively zero the difference between the first and second input of the amplifier 702 such that the amplifier only sees a difference between its inputs when the output current of the power switching converter is not zero.

Again the operation of the current sensor is such that:

$$\overline{VDS} = RDSON \times \overline{IL} \times D \times (1-DO) = RDSON \times \overline{IOUT} \times D$$

and $$VRTZ = D \times \overline{VDAC} = \frac{N}{N_{\Delta t}} \times RDSON \times k \times IDAC \times D,$$

where D is the duty cycle of the buck high side switch 1402 and DO is the duty cycle of the boost low-side switch 1406.

The sigma delta modulator ensures that $$\overline{VRTZ} = \overline{VDS}$$

hence $$\overline{IOUT} = \frac{N}{N_{\Delta t}} \times k \times IDAC.$$

Thanks to the return-to-zero switches 1350 and 1502 the system 1500 can generate a bit stream which reproduces the history of the output current of the buck-boost converter 1400.

Figure 16:
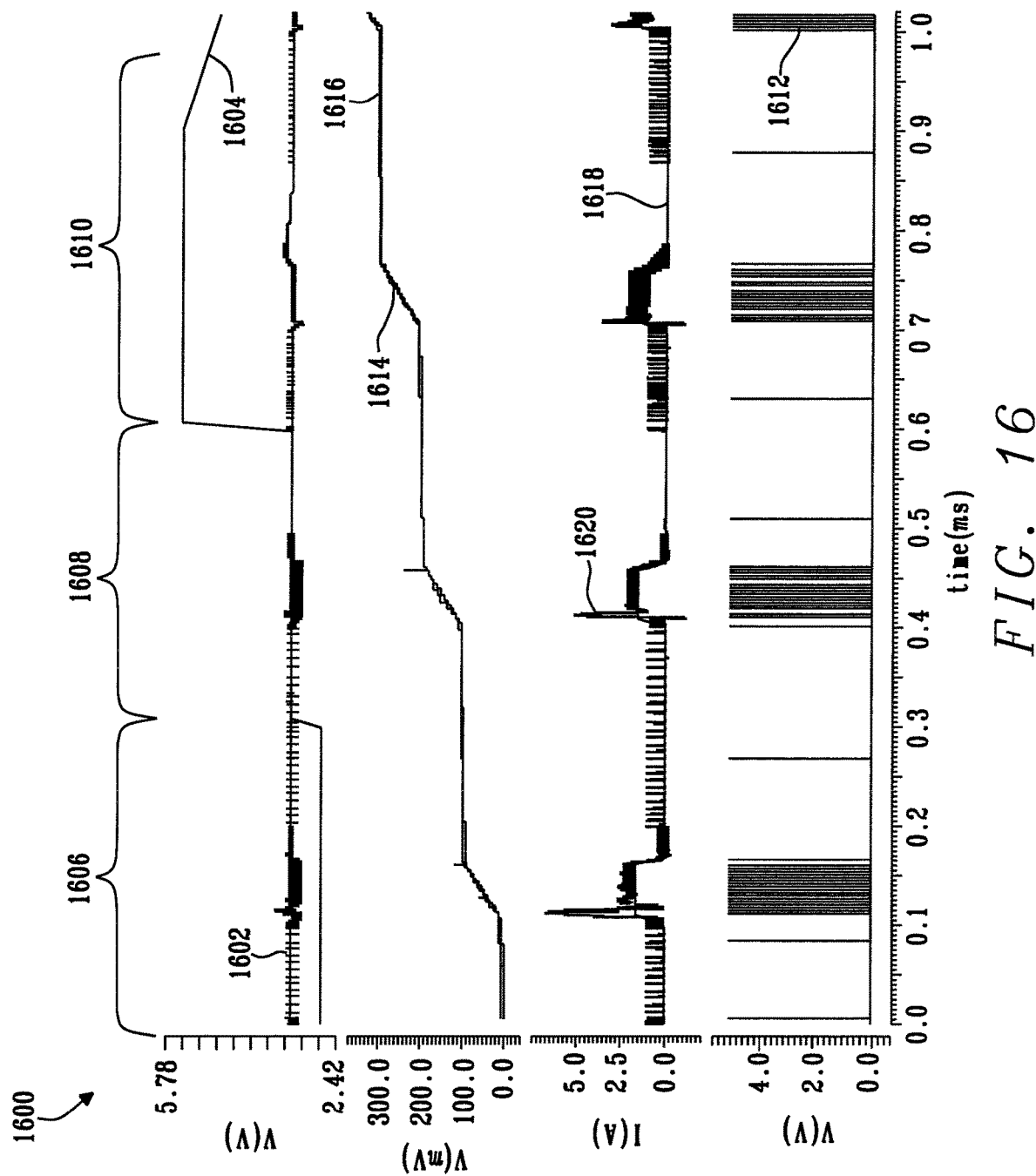
FIG. 16 is a graph showing a simulation of the system of FIG. 15 in use with a high side switch of a buck boost power converter.

FIG. 16 is a graph showing a simulation of the system 1500 of FIG. 15 in use with a high side switch of a buck boost power converter.

The lineplot 1602 is the simulated output voltage VOUT.

The lineplot 1604 illustrates the input voltage of the power converter VIN. Three different values of VIN were considered during the simulation to simulate the different behaviors of the buck-boost converter. In the first stage 1606 the voltage VIN was set such that the buck-boost converter functioned as a boost converter. In the second stage 1608 the voltage VIN was set such that the buck-boost converter functioned as a buck-boost converter. In the third stage 1610 the voltage converter was set to a value such that the buck-boost converter operated as a buck converter.

The simulated power switching converter was configured to have an average output voltage equal to 3.3V throughout the three stages.

The lineplot 1620 represents the simulated current IL flowing through the inductor of the buck-boost converter and the lineplot 1618 represents the simulated current IOUT of the power converter. The simulated output current IOUT was varied during the simulation to simulate the power converter both in pulse frequency and pulse density modulation modes.

The lineplot 1612 represents the output of the sigma delta modulator (bts$\Sigma\Delta$).

The lineplot 1614 represents the cumulative number of pulses in the pulse density modulated signal bts$\Sigma\Delta$ and the line 1616 represents the simulated integral value of the average output current IOUT. In particular, the lineplot 1616 is $N/N_{\Delta t} \times IFS$. For this simulation, $N_{\Delta t}=512$. As shown in FIG. 16, the measurement derived from the pulse density modulated signal is very accurate and exhibits an error which is <5%.

It will be appreciated that in different embodiments, various features described with reference to FIG. 8A, 13 or 15 may be omitted without departing from the scope of the present disclosure. For example, if in a specific application the objective is to measure the current IL of the inductor L of the switching power converter rather than the actual output current IOUT, the switch 1502 could be omitted by the system 1500 such that the pulse density modulator 1522 returns a bit stream proportional or approximately proportional to the average current IL.

It will also be appreciated that although the methods and systems of the present disclosure have been described with reference to a specific polarization of the switches of the power converter, the methods and systems of the present disclosure are not limited to any specific polarization.

Furthermore, it will be appreciated that the switches of the systems according to the present disclosure may be implemented in various ways, as will be known to the person skilled in the art. For example, one or more of the switches of the systems according to the present disclosures may comprise a transistor. In particular, the sensor switches and the power converter switches discussed in the present disclosure may be switches comprising a field effect transistor (FET), such as a MOSFET.

The skilled person will appreciate that although the present description focussed on DC-DC switching power converters, the methods and systems of the present disclosure may apply to any power converter which comprise a switch, such as a FET switch, that passes current intermittently. For example, the methods and systems of the present disclosure may apply to AC/DC power converter or to capacitive power converters (power converter implemented using charge-pumps).

The skilled person will also appreciate that although a counter is the cheapest and simplest way for implementing the step of sensing the average output current of the switching power converter from the pulse density modulated signal, the methods and systems of the present disclosure may include using any other suitable digital or non-digital means for sensing said average output current. from the pulse density modulated signal. For example, embodiments of the present disclosure may use any mean of accumulator or digital filter to process the pulse density modulated signal and therefore provide a measurement of the average output current.

As previously mentioned, the pulse density modulator may also be a multi-bit pulse density modulator. That is, the pulse density modulator may be configured to output a pulse density modulated signal which has more than 2 states. In embodiments using a multi-bit pulse density modulator, the current IDAC may be generated using a digital-to-analog converter. For example, for 2-bit pulse density modulator having a full-scale current $IFS_{\Sigma\Delta}=6$ A, then the current supply 710 and the DAC switch 712 may be replaced by a current DAC configured such that:

when the PDM signal is 00, the current DAC provides to the sensor switch a current IDAC=0 A/k;
when the PDM signal is 01, the current DAC provides to the sensor switch a current IDAC=2 A/k;
when the PDM signal is 10, the current DAC provides to the sensor switch a current IDAC=4 A/k; and
when the PDM signal is 11, the current DAC provides to the sensor switch a current IDAC=6 A/k.

In the above example a pulse still corresponds to each bit in the pulse density modulated signal and so it will be appreciated that there may be more than 1 bits in the pulse modulated signal in any given clock cycle. For example, 00 is 0-bit, hence a clock in which the PDM signal is 00 would correspond to 0 pulses; 01 is 1 bit, hence a clock in which the PDM signal is 01 corresponds to one pulse; 10 is 2 bits, hence a clock in which the PDM signal is 02 corresponds to 2 pulses; and 11 is 3 bits, hence a clock in which the PDM signal is 03 corresponds to 3 pulses.

In some embodiments, the pulse density modulators of the present disclosure may have a fully differential implementation. An example is shown in FIG. 17.

Figure 17:
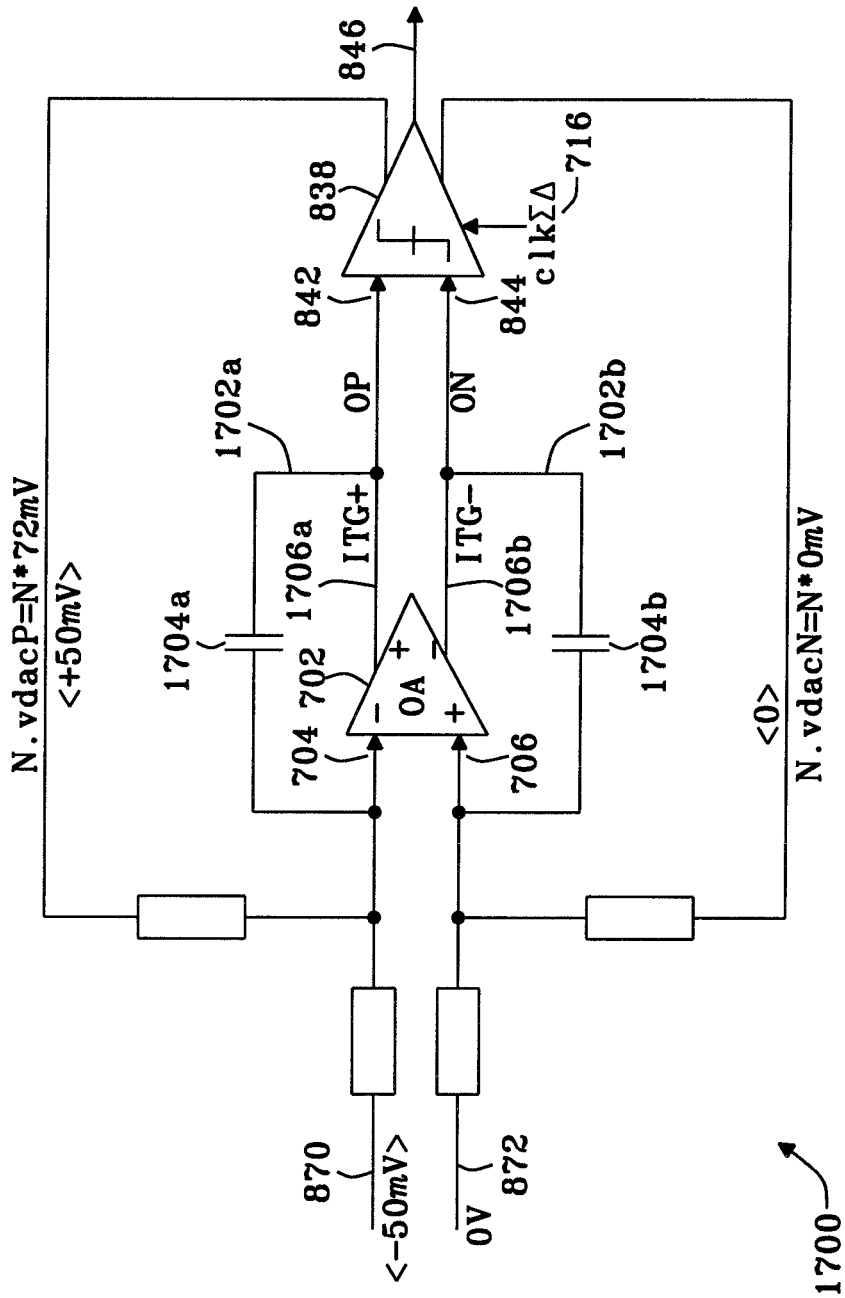
FIG. 17 is a schematic diagram of a fully differential implementation of the current sensor of FIG. 8A.

FIG. 17 is a schematic diagram of a fully differential implementation of the pulse density modulator 822 of FIG. 8A. Some elements of the pulse density modulator 822 are omitted in FIG. 17, as will be obvious to the person skilled in the art. Common reference numerals and variables between Figures denote common features.

In this specific implementation, the amplifier 702 has two outputs (1706a, 1706b) for generating two currents ITG+ and ITG−, each output being coupled to a feedback loop (1702a, 1702b) and each feedback loop comprising a capacitor (1704a, 1704b). The first input of the quantizer 842 is coupled to the output 1706a and the second input of the quantizer 844 is coupled to the output 1706b of the amplifier.

In some embodiments, choppers may be used to reduce the offset of the amplifiers used in the sigma delta modulators.

In some embodiments the switching power converter may be part of the system 600, that is the system 600 may comprise a switching power converter and a current sensor for sensing the output current of said power converter.

The current sensing methods and systems of the present disclosure may also be applied to circuits other than switching power converters. For example, in further embodiments, the circuit 504 may be a circuit comprising a load switch arranged to drive a load.

Figure 18:
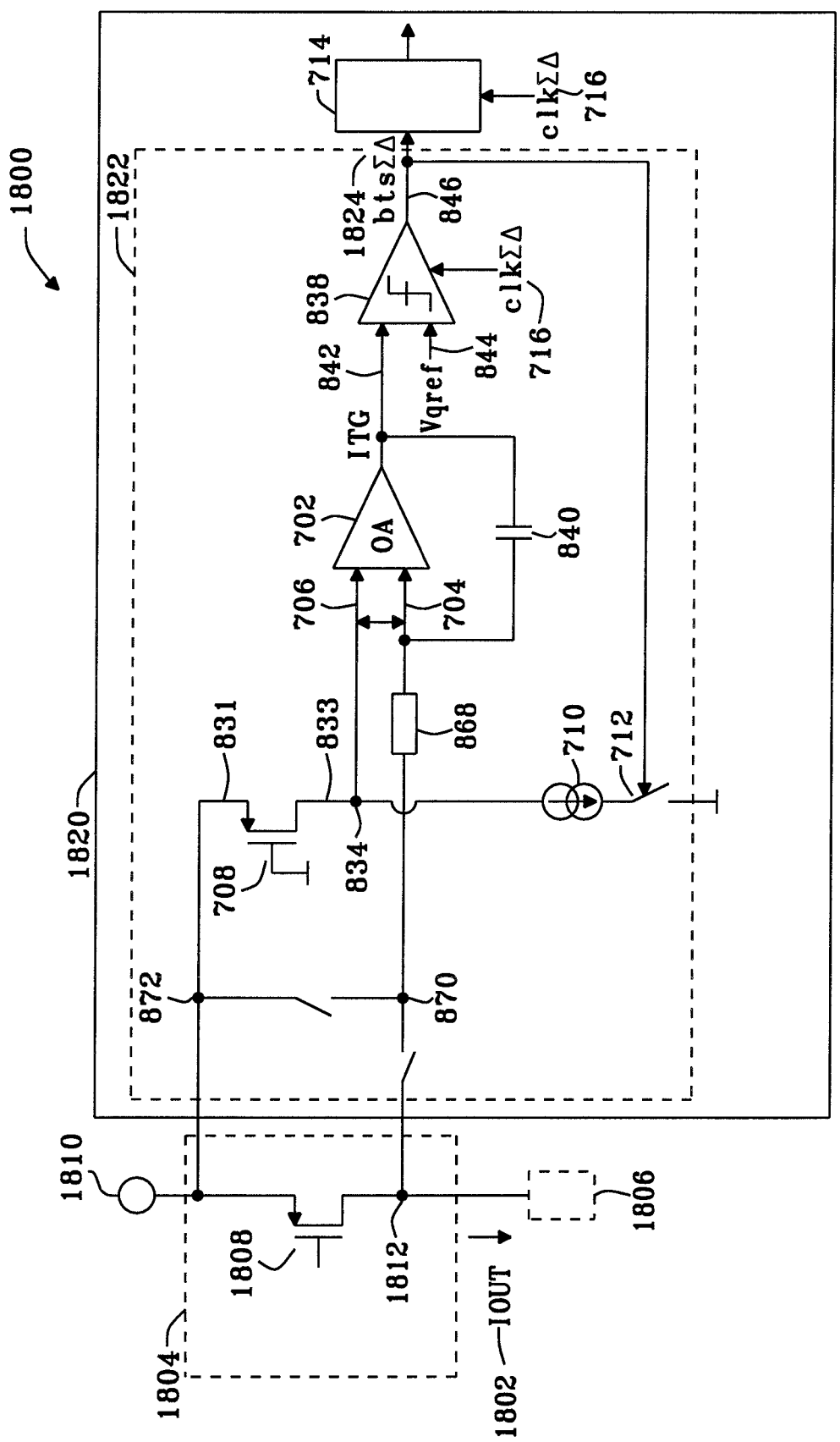
FIG. 18 is a schematic diagram of a system according to a third embodiment of the system of FIG. 5.

FIG. 18 is a schematic diagram of a system 1800 for sensing an output current 1802 of a circuit 1804, according to a third embodiment of the present disclosure. The system 1800 is an example of a specific embodiment of the system 500. Common reference numerals and variables between Figures denote common features. In an alternative embodiment the system 1800 may be for sensing the input current of the circuit 1804.

The circuit 1804 comprises a switch 1808 configured to drive a load 1806. The load 1806 may be for example a CPU. The switch 1808 may be for example a power FET switch. The switch 1808 may also be referred to as a load switch.

The load 1806 and the power switch are coupled at a switching node 1812. The switch 1808 is arranged to selectively couple the switching node 1812, and therefore the load 1806, to a first voltage 1810. The first voltage 1810 may be referred to as a reference voltage. It will be appreciated that the switch 1808 may remain in an ON state continuously over a long period of time, for example an hour. This may, for example, be the case when the circuit 1804 is implemented within a CPU.

The switch 1808 may be controlled to be alternatively on (closed) and off (open).

The system 1800 comprises a current sensor 1820. The current sensor 1820 comprises a pulse density modulator (PDM) 1822 configured to generate a pulse density modulated signal 1824 (bts$\Sigma\Delta$) which is dependent on an average of the current ISW flowing through the switch 1808. The current sensor 1820 is configured to sense the average output current of the circuit 1804 using the pulse density modulated signal 1824.

In this embodiment, the output current of the circuit 1804 is the current flowing through the switch 1808.

The working of the system 1800 is analogous to the workings of the system 1300. Briefly, the system 1800 may comprise a current sensor 1820 that is analogous to the current sensor 1320 of FIG. 13 and/or may comprise a pulse density modulator 1822 that is analogous to the pulse density modulator 1322. In a specific embodiment the pulse density modulator 1822 may not have a return-to-zero switch (1350), for example if the switch 1808 of the circuit 1802 does not have a predetermined duty cycle.

The pulse density modulator 1822 may be configured to receive a first differential signal via the first input 704 and a second differential signal via the second input 706, both differential signals being relative to the reference voltage 1810. In particular, the first differential signal, is given by the difference between a voltage coupled to the first input 704 and the reference voltage 1810, and the second differential signal is given by the difference between a voltage coupled to the second input 706 and the reference voltage 1810.

The pulse density modulator 1822 may be configured such that it continuously tries to eliminate the difference between the first differential signal, that is, the voltage difference (VDS) between the node 872 and the node 870, and the second differential signal, that is, the voltage difference between node 834 and the node 872.

The voltage difference between the nodes 872 and the node 870 may be given by $$\overline{VDS} = \overline{ISW} \times RDSON = \overline{IOUT} \times RDSON,$$

where $\overline{ISW}$ is the average current through the switch 1808.

$$\overline{VDAC} = IDAC \times RDSON \times k \times \frac{N}{N_{\Delta t}},$$

hence it follows from $\overline{VDS} = \overline{VDAC}$ that $$\overline{IOUT} = IDAC \times k \times \frac{N}{N_{\Delta t}}.$$

Figure 19:
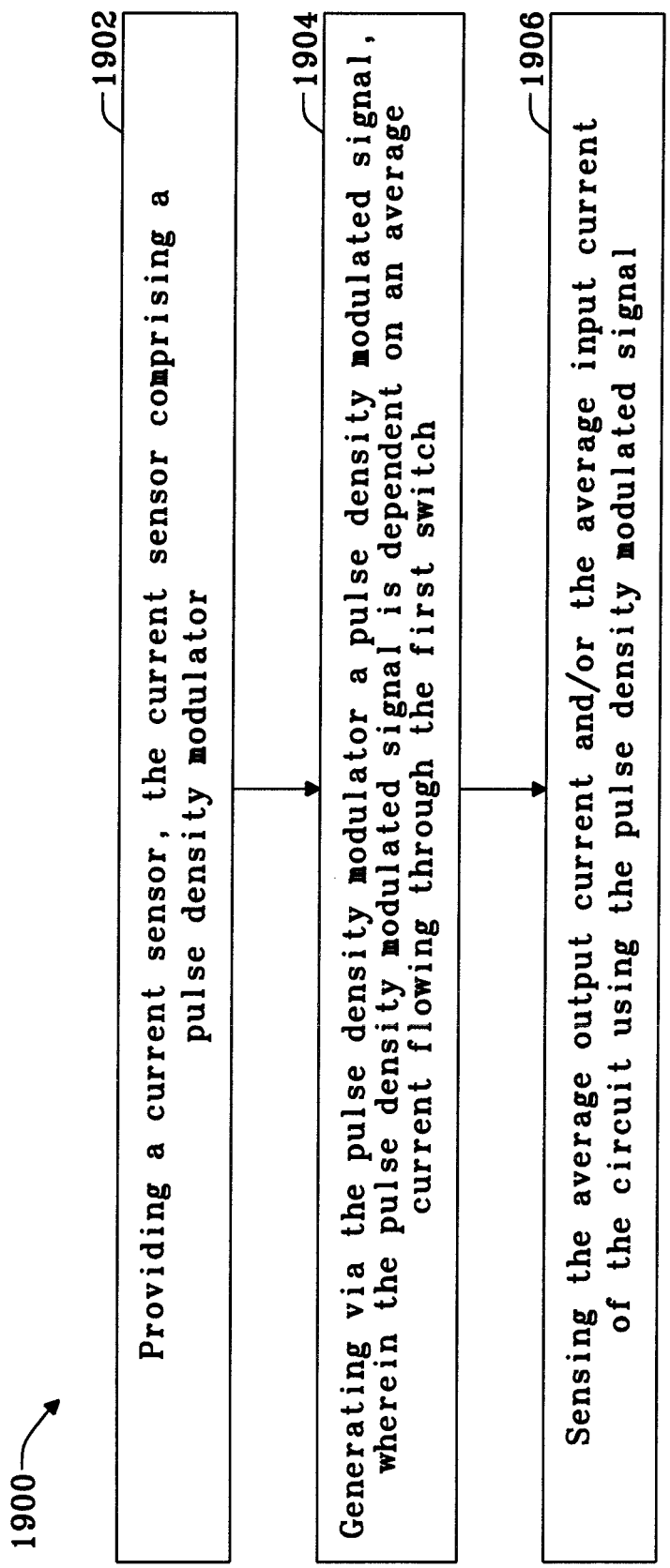
FIG. 19 is a schematic diagram of a current sensing method according to a fourth embodiment of the present disclosure.

FIG. 19 is a schematic diagram of a current sensing method according to a fourth embodiment of the present disclosure.

The method 1900 comprises steps for sensing an output current and/or an input current of a circuit comprising a first switch, the first switch being arranged to selectively couple a sensing node of the circuit to a first voltage. The method 1900 comprises: at step 1902, providing a current sensor, the current sensor comprising a pulse density modulator; at step 1904, generating via the pulse density modulator a pulse density modulated signal, wherein the pulse density modulated signal is dependent on an average current flowing through the first switch; and at step 1906, sensing the average output current and/or the average input current of the circuit using the pulse density modulated signal.

Figure 20:
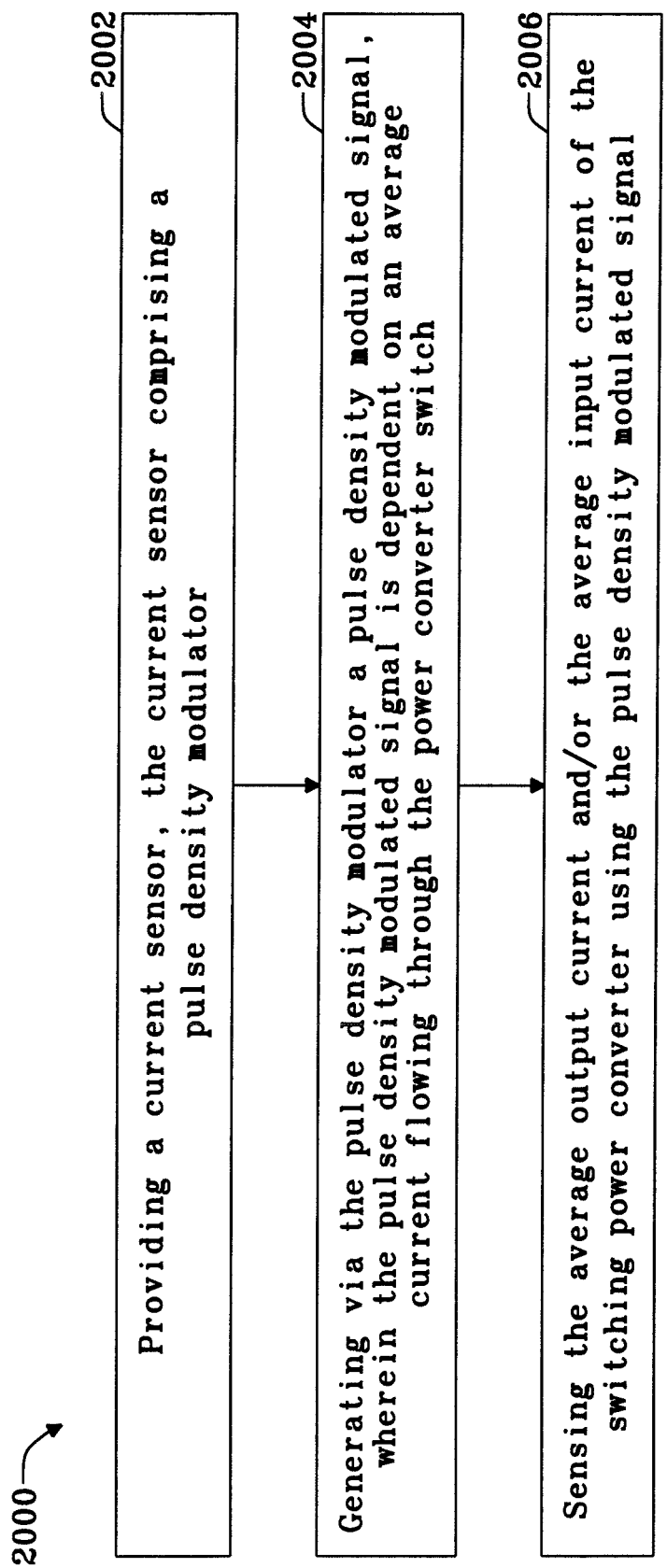
FIG. 20 is a schematic diagram of a current sensing method according to a fifth embodiment of the present disclosure.

FIG. 20 is a schematic diagram of a current sensing method according to a fifth embodiment of the present disclosure.

In particular, the method 2000 comprises steps for sensing an output current and/or an average input current of a switching power converter comprising an energy storage element and a first switch coupled at a switching node, the power converter switch being arranged to selectively couple the energy storage element to a first voltage. The first switch may be referred to as a power converter switch and the first voltage may be referred to as a converter reference voltage.

The method 2000 comprises: at step 2002, providing a current sensor, the current sensor comprising a pulse density modulator; at step 2004, generating via the pulse density modulator a pulse density modulated signal, wherein the pulse density modulated signal is dependent on an average current flowing through the first switch, or power converter switch; and at step 2006, sensing the average output current and/or the average input current of the switching power converter using the pulse density modulated signal.

In some embodiments, the method 2000 may comprise additional steps. In particular, in some embodiments where it is possible to synchronize a clock of the pulse density modulator with a switching time of the power converter switch, the method further comprises:
  providing a differential circuit in the pulse density modulator, said differential circuit having a first input and a second input;
  generating the pulse density modulated signal based on a difference between a sensing signal and a compensating signal, where the compensating signal comprises a difference between a voltage coupled to the first input and the converter reference voltage; and the sensing signal comprises a difference between a voltage coupled to the second input and the converter reference voltage;
  providing one or more return to zero switches;
  controlling the one or more return to zero switches according to a duty cycle of the power converter switch; and zeroing via the one or more return to zero switches the difference between the sensing signal and the compensating signal when the power converter switch is open.

It will be appreciated that one or more steps of the above methods may be omitted and/or executed in a different order without departing from the scope of the present disclosure.

Figure 21:
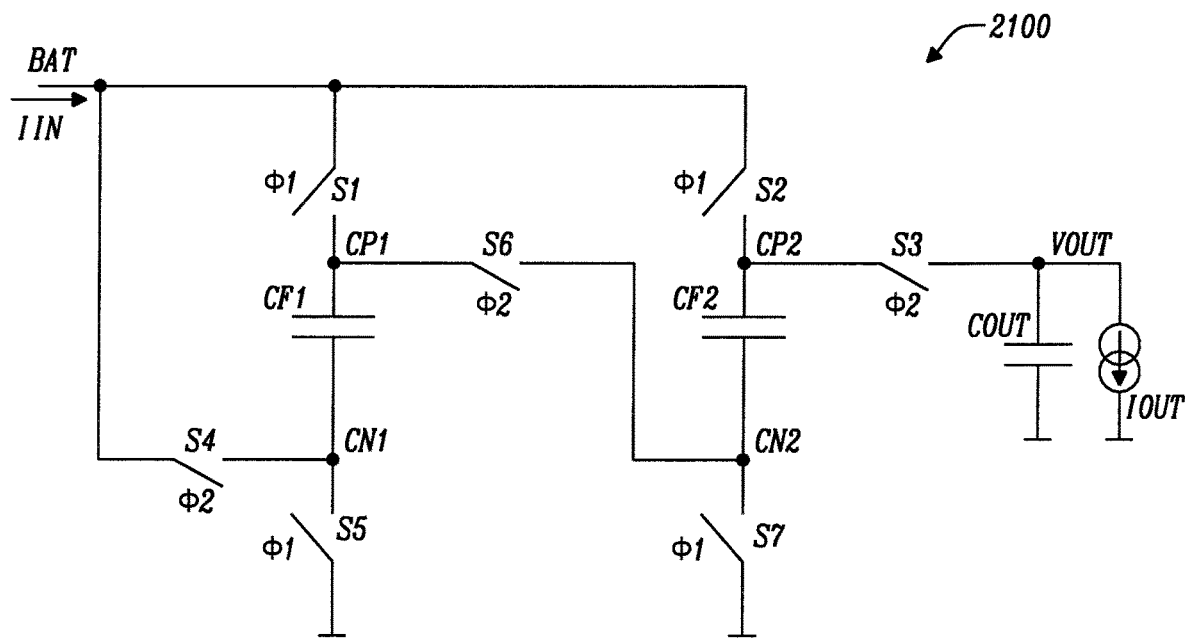
FIG. 21 is a schematic of a 3× multiplier charge pump as is known in the prior art.

FIG. 21 is a schematic of a 3× multiplier charge pump 2100 as is known in the prior art. It will be appreciated that the same topology may be operated in a different manner to achieve a 2× mode, in accordance with the understanding of the skilled person.

During a first period of time, denoted by $\Phi_1$, switches S1, S2, S5 and S7 are in a closed state such that they permit the flow of current. During the first period of time, the switches S3, S4, S6 are open thereby preventing the flow of current. During the first period of time the nodes CN1 and CN2 are at 0V, and the nodes CP1, CP2 are at the voltage of a battery "V(BAT)" (the battery being denoted by BAT). The capacitors CF1, CF2 store the voltage V(BAT).

During a second period of time, denoted by $\Phi_2$, switches S1, S2, S5 and S7 are in an open state and the switches S3, S4, S6 are in a closed state, such that CP1 becomes equal to twice V(BAT) (which may be denoted by 2*V(BAT)) and is applied to CN2. Hence CP2 becomes equal to three times V(BAT) which may be denoted by 3*V(BAT).

Figure 22:
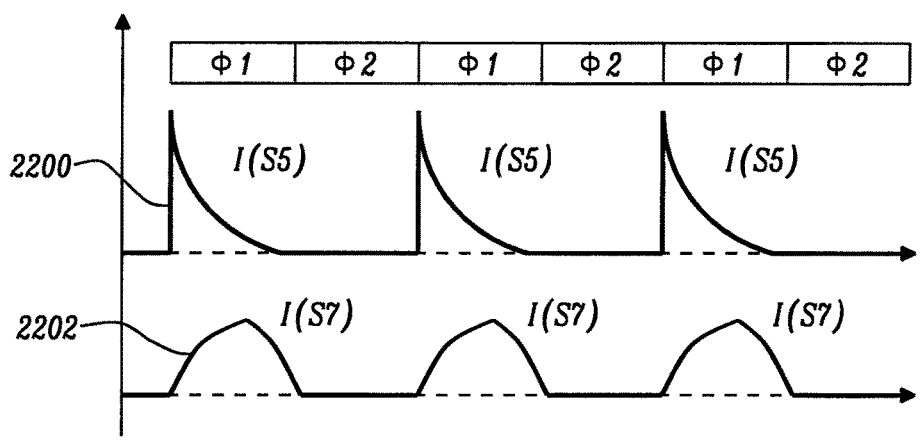
FIG. 22 is a graph showing the current flowing through each switch of two switches present in the charge pump of FIG. 21.

FIG. 22 shows a trace 2200 showing the current I(S5) flowing through the switch S5 during $\Phi_1$ followed by $\Phi_2$ with the sequence then being repeated. FIG. 22 also shows a trace 2202 showing the current I(S7) flowing through the switch S7 during $\Phi_1$ followed by $\Phi_2$ with the sequence then being repeated.

The current shapes that "top up" CF1, CF2 are random as shown in FIG. 22. They are 0 on $\Phi_2$, and they can take e.g. the characteristic of an R, C charge as shown in FIG. 22 for I(S5), or in case of parasitic inductor a smoother characteristic as in I(S7).

It is desirable to accurately measure the input current IIN, which in the present example is the current consumed on V(BAT), and is ideally equal to three times the output current IOUT (3*IOUT), In practice the value of IIN is likely to differ from three times the output current IOUT, and knowledge of the true value of IIN can allow optimization of efficiency.

Current is taken from BAT during $\Phi D_1$ through S1, S2 to top up CF1 and CF2. Then extra current is taken from BAT on $\Phi_2$ through S4.

Steady state equations show that: IIN=1.50*[<I(S5)>+<I(S7)>]

The factor 1.50 is mathematical (exact value). <I(S5)> and <I(S7)> are the average values.

Figure 23:
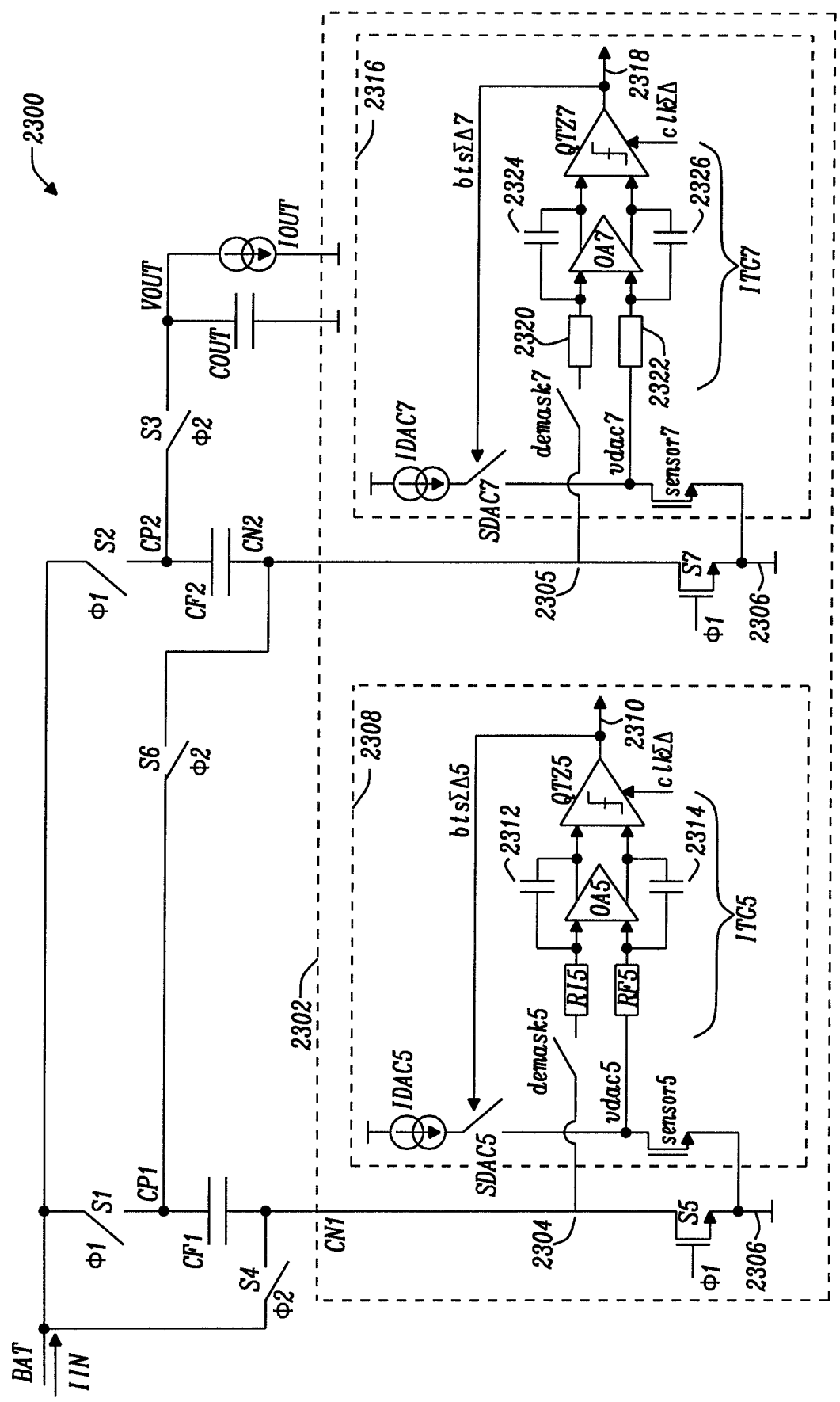
FIG. 23 is a schematic of a charge pump in accordance with a sixth embodiment of the present disclosure.

FIG. 23 is a schematic of a charge pump 2300 in accordance with a sixth embodiment of the present disclosure. The charge pump 2300 comprises a current sensor 2302 for sensing an average input current of a circuit (being the charge pump 2300) comprising the switch S5 and the switch S7. The charge pump 2300 may, for example, be operated in 3× or 2× mode, in accordance with the understanding of the skilled person.

The switch S5 is arranged to selectively couple a sensing node 2304 of the circuit to a first voltage 2306. The switch S7 is arranged to selectively couple a sensing node 2305 of the circuit to the first voltage 2306.

The current sensor 2302 comprises a pulse density modulator 2308 configured to generate a pulse density modulated signal 2310, the pulse density modulated signal 2310 being dependent on an average current flowing through the switch S5.

The current sensor 2302 is configured to sense the average input current of the circuit using the pulse density modulated signal 2310.

The pulse density modulator 2308 comprises a current source IDAC5, switches SDAC5, demask5, sensor5; resistors RIS, RFS; capacitors 2312, 2314; op amp OA5 and comparator QTZ5.

The current sensor 2302 further comprises a pulse density modulator 2316 configured to generate a pulse density modulated signal 2318, the pulse density modulated signal 2318 being dependent on an average current flowing through the switch S7.

The current sensor 2302 is configured to sense the average input current of the circuit using the pulse density modulated signal 2318.

The pulse density modulator 2316 comprises a current source IDAC7, switches SDAC7, demask7, sensor7; resistors 2320, 2322; capacitors 2324, 2326; op amp OA7 and comparator QTZ7.

It will be appreciated that the present example uses two pulse density modulators for determination of currents flowing through two switches to determine the input current, and that in further embodiments only a single switch and single pulse density modulator may be presented, as described previously and in accordance with the understanding of the skilled person.

In a further embodiment there may be two pulse density modulators for current determination, with only one of the pulse density modulators being used depending on the charge pump operation, and in accordance with the understanding of the skilled person.

Operation of the charge pump 2300 may be summarized as follows:

S5 may be an NMOS in practice. When current periodically passes through S5, the demask5 switch is turned on and connects CN1 to the integrator ITO, which stores in average the voltage RS5*<I(S5)>.

By integration, ITO accumulates RS5*I(S5) and once the differential voltage at the output of ITO exceeds 0V, the block QTZ5 emits '1' and turns on SDAC5. This injects IDAC5 into sensor5. The decision of QTZ5 is clocked at a frequency which can be different from the one of the charge-pump, i.e. the one that clocks F1.

The sensors may be sized k-times smaller than S5, and IDAC5 may be sized k-times smaller than the full-scale FS5. For example: <I(S5)> can be at maximum 4 A. Then we set FS5=5, and we take k=1000. So, we have IDAC=FS/1000 and sensor5=RS5*1000.

Once the bit-stream is '1' (as emitted by QTZ5), this means: vdac=(FS/1000)*(1000*RS5)=FS5*RS5

It applies a voltage guaranteed to be greater than R5*I(S5). As a consequence, the integrator now decreases its output until QTZ5 sets its output back to '0', which switches off SDAC5.

We see that we generate a Sigma-Delta bit-stream, whose average value (whichever digital way to extract this average) is named <bts5>, between 0 and 1, and matches in average the two inputs of ITO: RS5*<I(S5)>=<bts5>*FS5*RS5

In other words: <I(S5)>=FS5*<bts5>

The same principle may be applied to sense the current through S7 which is independent of the system on S5. For example, the ratio k, the full-scale FS7, the integrator ITG7 property and even the sigma-delta clocking frequency can differ, as long as the bitstream density accurately tracks the average current the same way: <I(S7)>=FS7*<bts7>.

Figure 24:
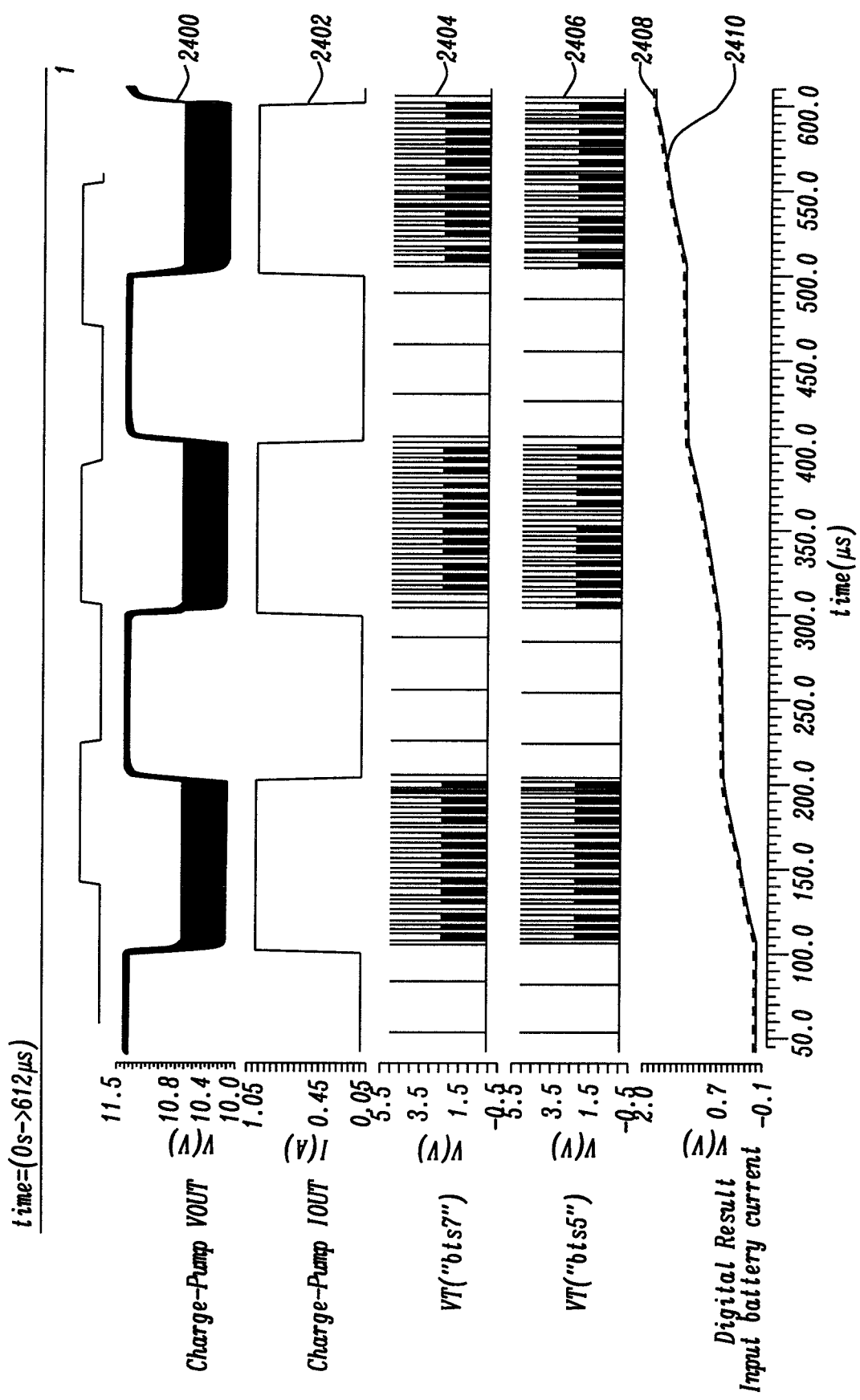
FIG. 24 is a graph showing the operation of the charge pump of FIG. 23 with time.

FIG. 24 is a graph showing the operation of the charge pump 2300 with time. The following is shown: an output voltage VOUT of the charge pump 2300 (trace 2400); an output current IOUT of the charge pump 2300 (trace 2402); the pulse density modulated signal 2318, corresponding to bts7 (trace 2404); the pulse density modulated signal 2310, corresponding to bts5 (trace 2406); the input battery current IIN (trace 2408) and the calculated output current provided by IIN=1.50*[<I(S5)>+<I(S7)>] (trace 2410). It can be observed that traces 2408, 2410 overlap, thereby indicating good agreement by the sensed average input current and the true value of the input current IIN.

The operation of the charge pump 2300 with reference to FIG. 24 is as follows:

The charge-pump output VOUT (trace 2400) drops whenever IOUT (trace 2402) is pulsed. At high IOUT, then IIN is high too and is preferably sensed.

At high load, I(S5) and I(S7) increase to top-up CF1, CF2 with more current. We see the two-independent bit-streams for I(S5) (2406) and I(S7) (2404) having a higher '1' density.

At light load, the '1' pulses are scarce yet accurately track <I(S5)> and <I(S7)>.

Both bit-streams are summed in the digital domain, and their sum is multiplied by 1.5. Then its integral is compared to the integral on IIN (last strip), showing the system accurately senses IIN (traces 2408, 2410).

The sensing scheme of the charge pump 2300 may be pseudo-differential such that the feedback vdac's are single ended, while the integrators are fully-differential. This allows a reduction in current consumption: if no current passes in average through S5 and S7, then hardly any '1' are generated and IDAC5, IDAC7 are OFF most of the time, thus not drawing current from the supply.

It will be appreciated that the current sensing method as presented in FIG. 23 may be applied to any capacitive converter (up/down) or any other system (hybrid) where sensing an average current through at least one switch allows calculation of the average input current of the converter.

Furthermore, the sensing sigma-delta(s) have bit-stream frequencies that can differ from each other, and that can differ from the charge-pump frequency. When the charge pump frequency is very low, the charge-pump can operate at light load.

The current sensing methods and systems of the present disclosure may also be used to measure the average inductor current in switching power converters operated in average current mode.

The methods and systems of the present disclosure allow to integrate the output current of a switching power converter over a longer time (e.g. 1 ms) at the same or a lower cost than prior art system and whilst keeping implementation area at a minimum. This is particularly important when an integrated circuit comprises many switching power converters (including multi-phase converters) and the current of each of them must be monitored.

Moreover, the methods and systems according to the present disclosures allow to maintain a very low consumption throughout operation, which is indispensable for power converter which must be capable of operating in pulse frequency mode (or "un-synced mode"). Typically, the maximum current suitable for power switching converters operated in pulse frequency mode is <50 μA. The methods and systems of the present disclosure are capable of operating at <10 μA.

The methods and systems according to the present disclosure also enable seamless current sensing when the switching power converter switches between pulse width mode and pulse frequency mode, which is an important advantage since there may be uncontrolled transitions between these two modes.

Yet another advantage of the methods and system of the present disclosure is that they deliver current measurements with an accuracy higher than +/−5% in closed loop in all the conditions.

The current measurements provided by the methods and systems of the present disclosure may, for example, be used by a user to determine whether the system is functioning correctly. Alternatively, or in addition to, providing the current measurement as an output to the user, the current measurement may be used internally by the system to control certain operations, to evaluate the functioning of the system and/or to take action in response to a specific current measurement, for example if it is indicative of a problem within the system.

Various improvements and modifications may be made to the above without departing from the scope of the disclosure.

What is claimed is:

1. A system comprising a current sensor for sensing an average output current and/or an average input current of a circuit comprising a first switch, the first switch being arranged to selectively couple a sensing node of the circuit to a first voltage, wherein
the current sensor comprises a pulse density modulator configured to generate a pulse density modulated signal, the pulse density modulated signal being dependent on an average current flowing through the first switch;
the current sensor is configured to sense the average output current and/or the average input current of the circuit using the pulse density modulated signal;
the pulse density modulator comprises a sensor current supply and a differential circuit having a first input and a second input and is configured to maintain an average difference between the first input and the second input at zero;
the pulse density modulator is configured to generate the pulse density modulated signal based on a difference between a sensing signal and a compensating signal;
the compensating signal is provided by coupling the first input with a return to zero node coupled with the sensor current supply and the second input with a converter reference node coupled with the first voltage; and
the sensing signal is provided by coupling the first input with a first sensing node coupled with the circuit sensing node and the second input with a second sensing node coupled with the first voltage.

2. The system of claim 1 wherein sensing the average output current and/or the average input current of the circuit using the pulse density modulated signal comprises counting a number of pulses in the pulse modulated signal.

3. The system of claim 1, wherein
the pulse density modulator comprises a sensor switch, the sensor switch having an internal resistance which is dependent on an internal resistance of the first switch;
the pulse density modulator is configured to selectively provide a sensor current to the sensor switch; and
the current sensor is configured such that
the sensing signal is dependent on an average current flowing through the first switch; and
the compensating signal is dependent on an average current flowing through the sensor switch.

4. The system of claim 3, wherein
selectively providing the sensor current to the sensor switch comprises only providing the sensor current to the sensor switch when a pulse is generated by the pulse density modulator.

5. The system of claim 4, wherein the pulse density modulator comprises
a sensor current supply configured to provide the sensor current to the sensor switch; and
a DAC switch coupled to the pulse density modulated signal, the DAC switch being configured to selectively provide a path for the sensor current;
wherein
selectively providing the path for the sensor current comprises providing the path for the sensor current only when the pulse is generated by the pulse density modulator.

6. The system of claim 1, wherein
the pulse density modulated signal is a signal configured to be either in a logic 0 state or in a logic 1 state;
the pulse density modulator is operated according to a clock signal; and
a pulse is any clock cycle in which the pulse density modulated signal is in the logic 1 state.

7. The system of claim 1, wherein
the pulse density modulator is a multi-bit pulse density modulator; and
the pulse density modulated signal is a signal configured to be either in a logic 0 state or in one of a plurality of logic non-zero states.

8. The system of claim 6, wherein the current sensor is configured to provide the number of pulses in the pulse modulated signal over a predetermined period of time.

9. The system of claim 8, wherein
the current sensor comprises a counter for counting the number of pulses in the pulse modulated signal;
the counter is operated according to the clock signal; and
the predetermined period of time comprises a predetermined number of clock cycles.

10. The system of claim 8, wherein the circuit is a switching power converter comprising an energy storage element; and the first switch is a power converter switch, the energy storage element and the power converter switch being coupled at the sensing node.

11. The system of claim 10, wherein the system comprises one or more return to zero switches, wherein
the one or more return to zero switches are controlled according to a fraction of a switching period of the power converter switch; and
the one or more return to zero switches are configured to zero the difference between the sensing signal and the compensating signal when the power converter switch is open.

12. The system of claim 10 wherein the sensor switch has a first terminal coupled to a return-to zero node and a second terminal coupled to the first voltage at a converter reference node.

13. The system of claim 12, wherein the pulse density modulator comprises
one or more first coupling switches for selectively coupling the first input to the switching node; and
one or more second coupling switches for selectively coupling the second input to the converter reference node;
wherein
selectively coupling the first input to the switching node comprises coupling the first input to the switching node during a fraction of a switching period of the power converter switch; and
selectively coupling the second input to the converter reference node comprises coupling the second input to the converter reference node during a fraction of the switching period of the power converter switch.

14. The system of claim 1 wherein
when the first switch is open, the first input and the second input are both coupled to the first voltage.

15. The system of claim 12, wherein the pulse density modulator is configured such that
the compensating signal is dependent on a voltage difference between the return-to zero node and the converter reference node; and
the compensating signal is dependent on a fraction of a switching period of the power converter switch;
wherein the number of pulses in the pulse modulated signal over the predetermined period of time provides a measure of the average output current and/or the average input current of the switching power converter over the predetermined period of time.

16. The system of claim 10, wherein
the pulse density modulator comprises one or more first return to zero switches for selectively coupling the first input to a compensating node; and
selectively coupling the first input to the compensating node comprises coupling the first input to the compensating node during a fraction of a switching period of the power converter switch.

17. The system of claim 12, wherein the pulse density modulator is configured such that
the compensating signal is equal or approximately equal to a voltage difference between the compensating node and the converter reference node; and
the number of pulses in the pulse modulated signal over the predetermined period of time provides a measure of the average current flowing through the power converter switch over the predetermined period of time.

18. The system of claim 12, the system further comprises one or more second return to zero switches for selectively coupling the return-to zero node to the converter reference node, wherein selectively coupling the return-to zero node to the converter reference node comprises coupling the return-to zero node to the converter reference node during a fraction of a switching period of the power converter switch.

19. The system of claim 12, wherein
the switching power converter is a buck-boost converter comprising a boost low side switch; and
the current sensor comprises one or more third return to zero switches for selectively coupling the first input to the converter reference node;
wherein selectively coupling the first input to the first voltage comprises coupling the second input to the converter reference node during a fraction of a switching period of the boost low side switch.

20. The system of claim 1 wherein the pulse density modulator comprises a sigma delta modulator.

21. A method for sensing an average output current and/or an average input current of a circuit comprising a first switch, the first switch being arranged to selectively couple a sensing node of the circuit to a first voltage, the method comprising
providing a current sensor comprising a pulse density modulator;
generating via the pulse density modulator a pulse density modulated signal, wherein the pulse density modulated signal is dependent on an average current flowing through the first switch; and
sensing the average output current and/or the average input current of the circuit
using the pulse density modulated signal; and wherein
the pulse density modulator comprises a sensor current supply and a differential circuit having a first input and a second input;
the differential circuit is configured to provide an average voltage difference between the first input and the second input is zero;
the pulse density modulator is configured to generate the pulse density modulated signal based on a difference between a sensing signal and a compensating signal;
the compensating signal is provided by coupling the first input with a return to zero node coupled with the sensor current supply and the second input with a converter reference node coupled with the first voltage; and
the sensing signal is provided by coupling the first input with a first sensing node coupled with the circuit sensing node and the second input with a second sensing node coupled with the first voltage.

* * * * *